(12) United States Patent
Hirashima et al.

(10) Patent No.: US 10,276,218 B2
(45) Date of Patent: Apr. 30, 2019

(54) SEMICONDUCTOR MEMORY DEVICE

(71) Applicant: Toshiba Memory Corporation, Tokyo (JP)

(72) Inventors: Yasuhiro Hirashima, Kawasaki Kanagawa (JP); Mami Kakoi, Yokohama Kanagawa (JP); Shinya Okuno, Fujisawa Kanagawa (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/904,426

(22) Filed: Feb. 26, 2018

(65) Prior Publication Data

US 2018/0261260 A1    Sep. 13, 2018

(30) Foreign Application Priority Data

Mar. 10, 2017  (JP) .................. 2017-046288

(51) Int. Cl.

| | |
|---|---|
| *G11C 5/02* | (2006.01) |
| *H01L 25/065* | (2006.01) |
| *G11C 29/50* | (2006.01) |
| *G11C 7/10* | (2006.01) |
| *G11C 7/20* | (2006.01) |
| *G11C 29/02* | (2006.01) |
| *H01L 25/00* | (2006.01) |

(52) U.S. Cl.
CPC ............ *G11C 5/025* (2013.01); *G11C 7/1057* (2013.01); *G11C 7/1084* (2013.01); *G11C 7/20* (2013.01); *G11C 29/022* (2013.01); *G11C 29/028* (2013.01); *G11C 29/50008* (2013.01); *H01L 25/0657* (2013.01); *G11C 2207/2254* (2013.01); *H01L 25/50* (2013.01)

(58) Field of Classification Search
CPC ..................... G11C 2207/2254; G11C 29/022
See application file for complete search history.

(56) References Cited

U.S. PATENT DOCUMENTS

| | | | |
|---|---|---|---|
| 8,513,121 B2 | 8/2013 | Ishino et al. | |
| 8,599,641 B2 | 12/2013 | Yoko et al. | |
| 9,496,042 B1* | 11/2016 | Abiko ................... | G11C 16/10 |
| 9,570,120 B2 | 2/2017 | Kim | |
| 2012/0069685 A1* | 3/2012 | Ide ....................... | G11C 29/787 |
| | | | 365/189.05 |
| 2016/0293229 A1 | 10/2016 | Kim | |
| 2017/0125119 A1* | 5/2017 | Loh ........................ | G11C 17/16 |
| 2018/0261290 A1* | 9/2018 | Uehara ................. | G11C 16/10 |

FOREIGN PATENT DOCUMENTS

| | | |
|---|---|---|
| JP | 2007-012848 | 1/2007 |
| JP | 2015-007989 | 1/2015 |

* cited by examiner

*Primary Examiner* — Tuan T Nguyen
(74) *Attorney, Agent, or Firm* — Kim & Stewart LLP

(57) ABSTRACT

A semiconductor memory device includes a plurality of memory chips that are stacked above one another and connected to each other through a through via, an interface chip that is connected to the plurality of memory chips, and a plurality of first terminals for connection with an external device. The interface chip includes a plurality of second terminals that are connected to the plurality of first terminals, and is capable of receiving a signal that is supplied from the external device through the first and second terminals, and stores configuration information according to which a set number of the second terminals are designated for receiving control signals for the plurality of memory chips.

20 Claims, 26 Drawing Sheets

FIG. 6

| CH Configuration | | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| A | IN-USE CH | CH0 | CH1 | CH0 | CH1 | CH0 | CH1 | CH0 | CH1 | CH0 | CH1 | CH0 | CH1 | CH0 | CH1 | CH0 | CH1 |
|   | CONTROL CE | CE0 | CE1 | CE2 | CE3 | CE0 | CE1 | CE2 | CE3 | CE0 | CE1 | CE2 | CE3 | CE0 | CE1 | CE2 | CE3 |
|   | CONTROL R/B̄ | RB0 | RB1 | RB2 | RB3 | RB0 | RB1 | RB2 | RB3 | RB0 | RB1 | RB2 | RB3 | RB0 | RB1 | RB2 | RB3 |
|   | Chip Address | CA0 | CA0 | CA0 | CA0 | CA1 | CA1 | CA1 | CA1 | CA2 | CA2 | CA2 | CA2 | CA3 | CA3 | CA3 | CA3 |
| B | IN-USE CH | CH0 | CH1 | CH0 | CH1 | CH0 | CH1 | CH0 | CH1 | CH0 | CH1 | CH0 | CH1 | CH0 | CH1 | CH0 | CH1 |
|   | CONTROL CE | CE0 | CE1 | CE0 | CE1 | CE0 | CE1 | CE0 | CE1 | CE0 | CE1 | CE0 | CE1 | CE0 | CE1 | CE0 | CE1 |
|   | CONTROL R/B̄ | RB0 | RB1 | RB0 | RB1 | RB0 | RB1 | RB0 | RB1 | RB0 | RB1 | RB0 | RB1 | RB0 | RB1 | RB0 | RB1 |
|   | Chip Address | CA0 | CA0 | CA0 | CA0 | CA2 | CA2 | CA3 | CA3 | CA4 | CA4 | CA5 | CA5 | CA6 | CA6 | CA7 | CA7 |
| C | IN-USE CH | CH0 | | | | | | | | | | | | | | | |
|   | CONTROL CE | CE0 | CE1 | CE2 | CE3 | CE0 | CE1 | CE2 | CE3 | CE0 | CE1 | CE2 | CE3 | CE0 | CE1 | CE2 | CE3 |
|   | CONTROL R/B̄ | RB0 | RB1 | RB2 | RB3 | RB0 | RB1 | RB2 | RB3 | RB0 | RB1 | RB2 | RB3 | RB0 | RB1 | RB2 | RB3 |
|   | Chip Address | CA0 | CA0 | CA0 | CA0 | CA1 | CA1 | CA1 | CA1 | CA2 | CA2 | CA2 | CA2 | CA3 | CA3 | CA3 | CA3 |
| D | IN-USE CH | CH0 | | | | | | | | | | | | | | | |
|   | CONTROL CE | CE0 | CE1 | CE0 | CE1 | CE0 | CE1 | CE0 | CE1 | CE0 | CE1 | CE0 | CE1 | CE0 | CE1 | CE0 | CE1 |
|   | CONTROL R/B̄ | RB0 | RB1 | RB0 | RB1 | RB0 | RB1 | RB0 | RB1 | RB0 | RB1 | RB0 | RB1 | RB0 | RB1 | RB0 | RB1 |
|   | Chip Address | CA0 | CA0 | CA1 | CA1 | CA2 | CA2 | CA3 | CA3 | CA4 | CA4 | CA5 | CA5 | CA6 | CA6 | CA7 | CA7 |
| E | IN-USE CH | CH0 | | | | | | | | | | | | | | | |
|   | CONTROL CE | CE0 | | | | | | | | | | | | | | | |
|   | CONTROL R/B̄ | RB0 | | | | | | | | | | | | | | | |
|   | Chip Address | CA0 | CA1 | CA2 | CA3 | CA4 | CA5 | CA6 | CA7 | CA8 | CA9 | CA10 | CA11 | CA12 | CA13 | CA14 | CA15 |

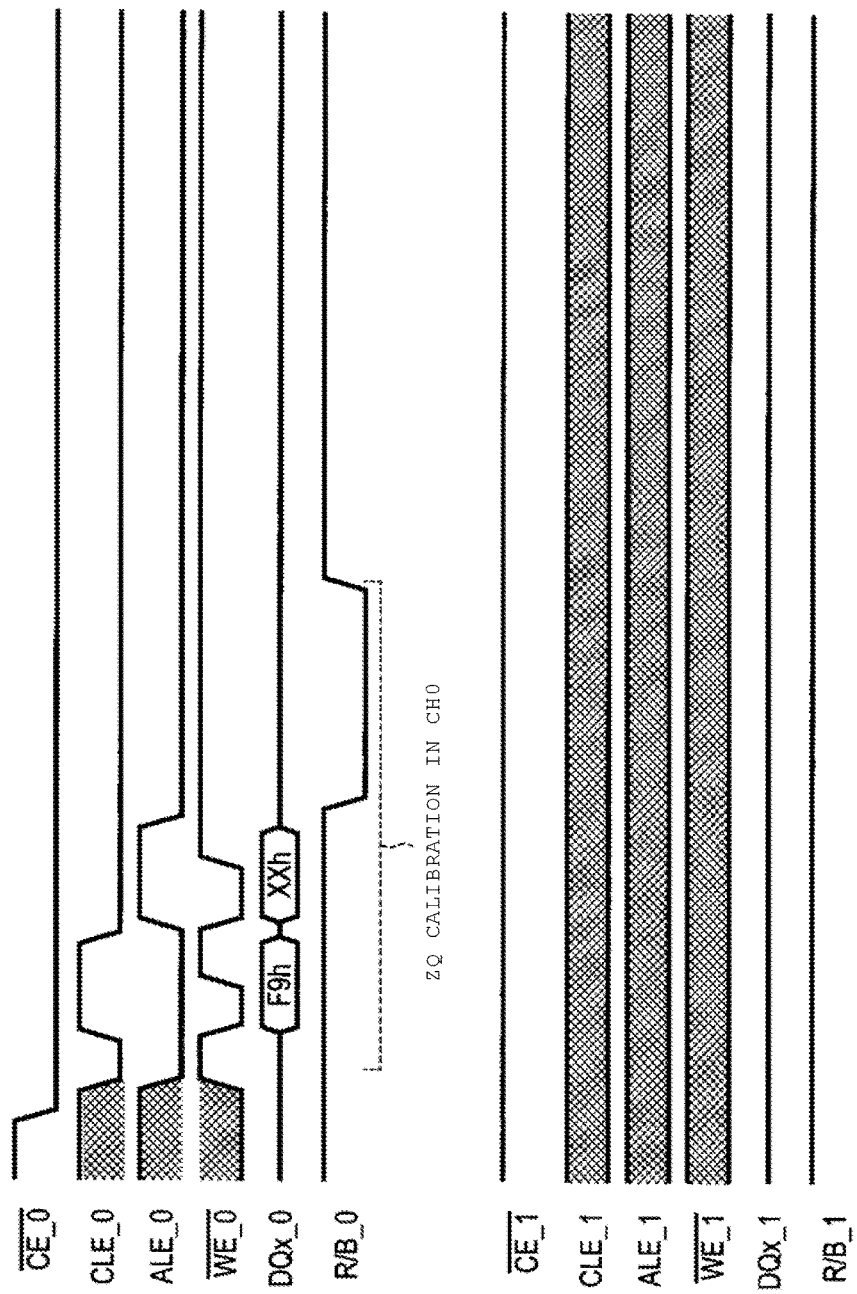

FIG. 26

| Cmd(HEX) | Add(HEX) | Data | DQ | CONTENTS | ARRANGEMENT |
|---|---|---|---|---|---|
| EFh/EEh | 02h | B0 | [0] | V_ref SWITCHING, 0: chip INTERNAL GENERATION, 1: EXTERNAL INPUT | IF CHIP |
| | | | [1] | DQS DIFFERENTIAL SWITCHING 0:single, 1:differential | IF CHIP |
| | | | [2] | RE DIFFERENTIAL SWITCHING 0:single, 1:differential | IF CHIP |
| | | | [3] | Reserve | IF CHIP |
| | | | [7:4] | TERMINATION RESISTANCE OFF/150Ω/100Ω/75Ω/50Ω | IF CHIP |
| | | B1 | [3:0] | Input Latency SETTING, DELAY IS CAUSED TO OCCUR FOR DURATION CORRESPONDING TO THE NUMBER OF SETTINGS | IF CHIP |
| | | | [7:4] | Output Latency SETTING, DELAY IS CAUSED TO OCCUR FOR DURATION CORRESPONDING TO THE NUMBER OF SETTINGS | IF CHIP |
| | 10h | B0 | [2:1] | ON-STATE RESISTANCE 50Ω/35Ω/25Ω/ | IF CHIP |
| | 85h | B0 | [7:0] | READING VOLTAGE ADJUSTMENT | CORE CHIP |
| | | B1 | [7:0] | READING VOLTAGE ADJUSTMENT | CORE CHIP |
| | | B2 | [7:0] | READING VOLTAGE ADJUSTMENT | CORE CHIP |
| | | B3 | [7:0] | READING VOLTAGE ADJUSTMENT | CORE CHIP |
| | B0h | B0 | [1:0] | NUMBER-OF-IN-USE-CH'S SETTING, ONLY IN CH0 AND IN CH0 + CH1 | CORE & IF |
| | | | [3:2] | NUMBER-OF-IN-USE-CE'S SETTING 1/2/4 | CORE & IF |
| | | | [5:4] | NUMBER-OF-IN-USE-RB'S SETTING 1/2/4 | CORE & IF |

SEMICONDUCTOR MEMORY DEVICE

CROSS-REFERENCE TO RELATED APPLICATION

This application is based upon and claims the benefit of priority from Japanese Patent Application No. 2017-046288, filed Mar. 10, 2017, the entire contents of which are incorporated herein by reference.

FIELD

Embodiments described herein relate generally to a semiconductor memory device and a method.

BACKGROUND

In a package for a semiconductor memory device, a plurality of memory chips are stacked on top of one another and a through silicon via (TSV) connects the memory chips to an interface chip that is provided on a semiconductor substrate.

DESCRIPTION OF THE DRAWINGS

FIG. 6 is a diagram illustrating an example of a plurality of chip configurations that are possible in the semiconductor memory device according to the embodiment.

FIGS. 22A and 22B are timing charts illustrating an example of the ZQ calibration operation in a first mode.

FIG. 26 is a diagram illustrating an example of contents of a register within the IF chip and/or the core chip.

DETAILED DESCRIPTION

Figure 1:
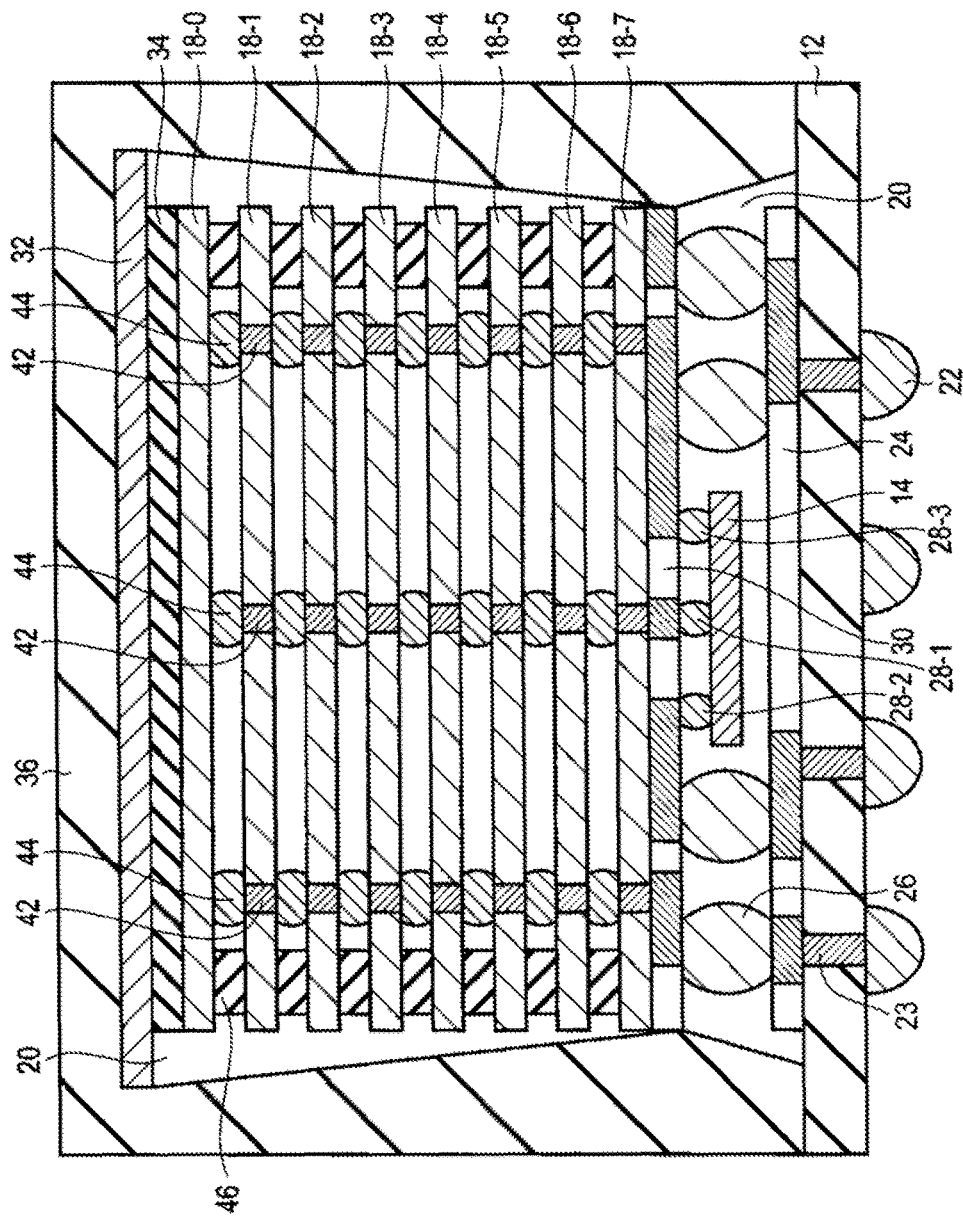
FIG. 1 is a diagram illustrating an example of a cross-sectional structure of a semiconductor memory device according to an embodiment.

Embodiments provide a semiconductor memory device and a method that is capable of selecting a plurality of memory chips that are stacked above one another.

In general, according to one embodiment, there is provided a semiconductor memory device that includes a plurality of memory chips that are stacked above one another and are connected to each other through a through via, an interface chip that is connected to the plurality of memory chips, and a plurality of first terminals for connection with an external device. The interface chip includes a plurality of second terminals that are connected to the plurality of first terminals, and is capable of receiving a signal that is supplied from the external device through the first and second terminals, and stores configuration information according to which a set number of the second terminals are designated for receiving control signals for the plurality of memory chips.

Embodiments will be described below with reference to the drawings. It is noted that the present disclosure is only an example, and that embodiments of the present disclosure are not limited to the embodiments disclosed herein. Modifications that a person of ordinary skill in the related art can contemplate fall within the scope of the present disclosure. For clearer description, in some cases, size, a shape, and the like of each constituent element of an actual embodiment are also changed to provide schematic illustrations in the drawings. In some cases, the same constituent elements across a plurality of drawings are given the same reference numerals and detailed descriptions thereof are not repeated. It is noted that in the following description, a "connection" means not only a direction connection, but also a connection through another element.

First Embodiment

Cross-Sectional Structure

FIG. 1 is a cross-sectional diagram illustrating an example of a semiconductor memory device according to a first embodiment. FIG. 1 illustrates a stacked layer of eight semiconductor chips, but the number of stacked layers may be any number, which is equal to or greater than two, without being limited to eight. The stacked-layer chip is not limited to the memory chip, and may be a chip such as one for a logic circuit or a processor. In the following description, a semiconductor memory is an example of a NAND flash memory, but it is not limited to this, and may be any one of a NOR flash memory, a Dynamic Random Access Memory (DRAM), a Ferroelectric Random Access Memory (FRAM®), a Magnetoresistive Random Access Memory (MRAM), and a Phase Change Random Access Memory (PCRAM). The semiconductor memory device includes an interface chip (hereinafter referred to as an IF chip) 14 and core chips 18-0 to 18-7. Each of the core chips 18-0 to 18-7 is a memory chip that includes a NAND flash memory. In a case where there is no need to distinguish among the core chips 18-0 to 18-7, the core chips 18-0 to 18-7 are referred to the core chip 18.

An IF chip 14 is disposed on an upper portion of a package substrate 12 that is made of bismaleimide triazine (BT) resin or the like. The package substrate 12 is a Ball Grid Array (BGA) substrate that includes many solder balls 22 (hereinafter also referred to as a solder bump) which is a terminal connectable to an external device. Hatching is omitted in FIG. 1, but a space between the package substrate 12 and the IF chip 14 is filled with sealing resin 20, such as mold resin. It is noted that the IF chip 14 may be disposed directly on the package substrate 12 without the sealing resin 20 interposed therebetween. The IF chip 14 can communicate with the core chip 18, and also can communicate with a controller (illustrated in FIG. 2). For example, the IF chip 14 can transmit a command, data, an address, and the like that are supplied from the controller to the core chip 18, can transmit data that is received from the core chip 18, and so forth, to the controller. For example, in a case where the semiconductor memory device is implemented in a Solid State Drive (SSD), the controller is an SSD controller and the controller is connected to a host apparatus, and thus the command, the data, the address, and the like are output from a host apparatus. It is noted that instead of the IF chip, a controller chip may be used to perform reading control of the core chip 18.

A stacked body of the core chips 18-0 to 18-7 is disposed on an upper portion of the IF chip 14. A spacer 46 is provided to secure a distance between two neighboring core chips 18. The spacer 46 is an insulating resin with adhesiveness, for example, such as epoxy resin, polyimide resin, acrylic resin, phenol resin, or benzocyclobutene resin. Front surface wiring and rear surface wiring are formed on the core chip 18, and the core chip 18 is stacked on top of one another in such a manner that a surface of the core chip 18, on which the front surface wiring is formed, faces downward (face down).

An upper surface of the uppermost core chip 18-0 (a surface on which the rear surface wiring is formed) is bonded to a support plate 32 with an adhesive 34 in between. For the adhesive 34, insulating resin may be used, and a die attachment film may be used. The support plate 32 serves the purpose of preventing mechanical stress from breaking down the core chip 18 when handling the stacked body of the core chip 18. For example, for the support plate 32, a metal plate may be used such as a lead frame. A material of the support plate 32 may be Cu or a 42 alloy (Fe—Ni alloy).

Many through silicon vias (each of which is hereinafter referred to as a through via for short) 42 are provided in the core chips 18-1 to 18-7 other than the uppermost core chip 18-0. Although not illustrated, the through via 42 is insulated by a sidewall insulating film from the core chip 18. For a material of the through via 42, Cu, Ni, Al, or the like can be used. The core chip 18 includes a cell area where a memory cell is formed and a peripheral area where a sense amplifier, a decoder, or the like is formed. The through via 42 may be provided in the peripheral area.

The through vias 42 in the core chips 18-1 to 18-7 are connected to the through vias in the upper core chips 18-0 to 18-6 through the solder ball 44, respectively. Accordingly, the through vias 42 that are at the same position in the core chips 18-1 to 18-7 are connected to each other, and the core chips 18-0 to 18-7 are connected by the through via 42 and a solder ball 44 to each other.

A rewiring layer 30 is provided on a lower surface (a surface on which the front surface wiring is formed) of the lowermost core chip 18-7. A wiring layer 24 is provided on an upper surface of the package substrate 12. A solder ball 26 is provided between the rewiring layer 30 and the wiring layer 24. The IF chip 14 includes many pads (illustrated in FIG. 3), which are terminals, in the upper chip surface thereof in FIG. 1, and the many pads are connected to the rewiring layer 30 through a plurality of solder balls 28, for example, solder balls 28-1, 28-2, 28-3, and the like.

The IF chip 14 is connected to the stacked body of the core chip 18, through the solder ball 28-1 and the rewiring layer 30. The IF chip 14 is electrically connected to the controller (illustrated in FIG. 2) through the solder balls 28-2 and 28-3, the rewiring layer 30, the solder ball 26, the wiring layer 24, wiring 23, and a solder ball 22. The stacked body of the core chip 18 is electrically connected to the controller through the rewiring layer 30, the solder ball 26, the wiring layer 24, the wiring 23, and the solder ball 22. A voltage from the controller may be supplied directly to the core chip 18 without passing through the IF chip 14.

The structure described above is disposed within a resin package 36 that is filled with the sealing resin 20. The resin package 36 may be configured with a material that is the same as the sealing resin 20.

Schematic Configuration of a System

Figure 2:
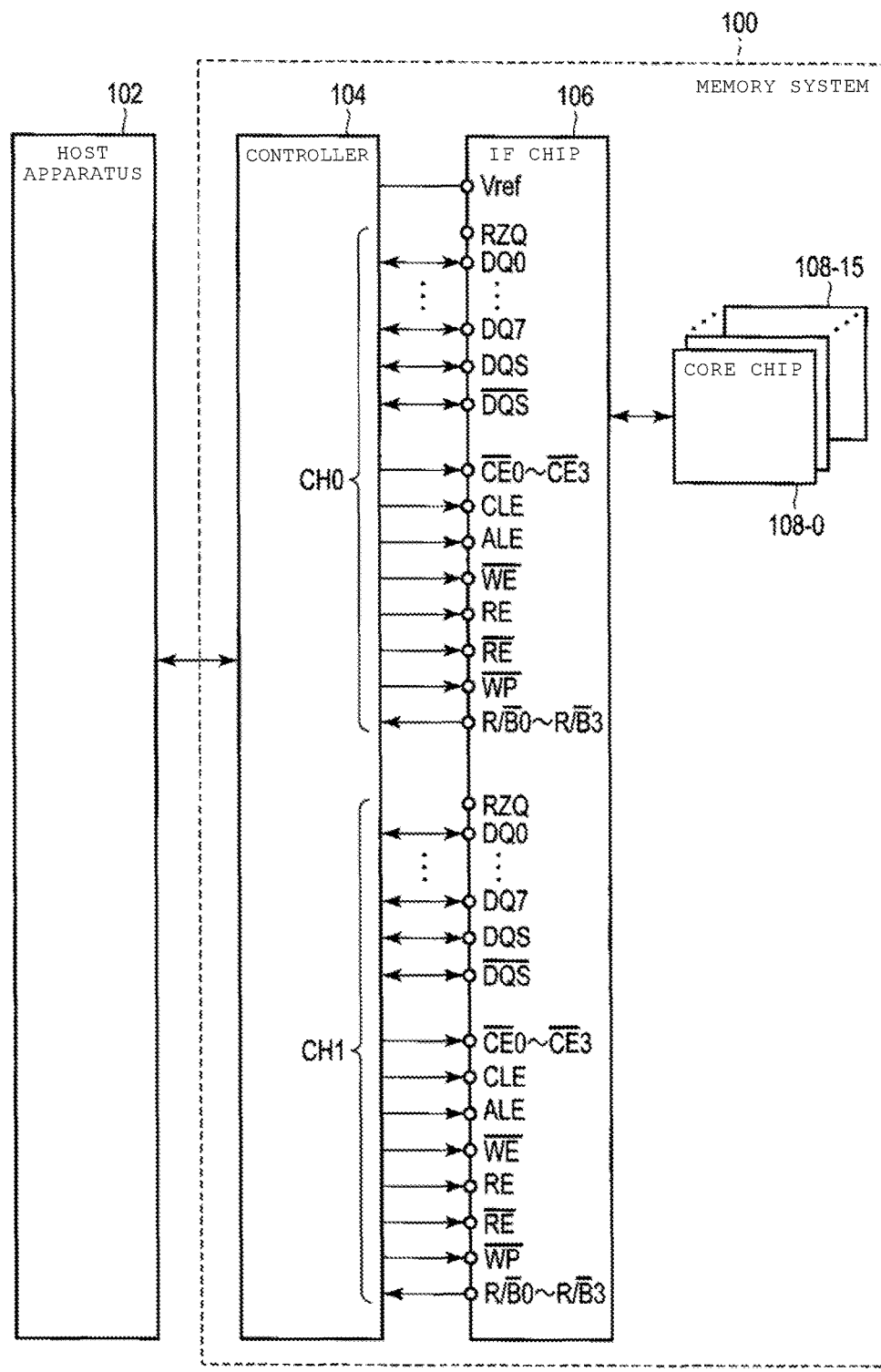
FIG. 2 is a block diagram illustrating an example of a schematic configuration of a system that includes the semiconductor memory device according to the embodiment.

FIG. 2 is a block diagram illustrating an example of a schematic configuration of a system that includes the semiconductor memory device as illustrated in FIG. 1. The system is configured with a host apparatus 102 and a memory system 100. The memory system 100 includes the semiconductor memory device that is configured with a plurality of stacked core chips (16 core chips here), core chips 108-0 to 108-15 and an IF chip 106, and a controller 108. The core chips 108-0 to 108-15 have the same structure, and, when not distinguished from one another, are referred to as a core chip 108. The IF chip 106 controls writing and reading to and from the core chip 108, and controls communication between the core chip 108 and a controller 104. For an interface of the memory system 100, a double data rate (DDR) at which data input and output is performed at a rising edge and a falling edge of a clock signal is employed.

The controller 104 is connected to the host apparatus 102 through a host interface. The host interface is determined by the type of device in which the memory system 100 is implemented. For example, in a case where the memory system 100 is implemented in a Solid-State Drive (SSD), a Serial Attached SCSI (SAS), a Serial ATA (SATA), a Programmable Communications Interface (PCIe), and the like are used as the host interface. In a case where the memory system 100 is implemented in a Universal Serial Bus (USB) and the like, a USB is used as the host interface. In a case where the memory system 100 is implemented in a Multi-Media Card (MMC), an interface in compliance with an MMC specification is used as the host interface. In a case where the memory system 100 is implemented in an SD card, an interface in compliance with an SD memory specification is used as the host interface.

In a case where data is written to the core chip 108 according to a request signal that is supplied from the host apparatus 102, the controller 104 supplies the data and a control signal to the IF chip 106 through a channel as a signal transfer path. Furthermore, the controller 104 receives the data that is read from the core chip 108 and the control signal, from the IF chip 106 through the channel. The number of channels between the controller 104 and the IF chip 106 is not limited to one, and in some cases, may be two or greater. At this point, it is possible that a plurality of channels (for example, two channels) are used. In a case where there are a plurality of channels, a channel that corresponds to a plurality of core chips is determined by a specification that is set by a user.

The controller 104 controls the core chip 108 through the IF chip 106 based on data, a command, and an address that are received from the host apparatus 102. The controller 104 generates various commands and outputs the generated various commands to the IF chip 106. The IF chip 106 corresponds to the IF chip 14 that is illustrated in FIG. 1, and the core chip 108 corresponds to the core chip 18 that is illustrated in FIG. 1.

Communication signals between the controller 104 and the IF chip 106 include I/O signals DQ0 to DQ7, differential (or also referred to as complementary) data strobe signals DQS and DQSn, a plurality of chip enable signals, for example, chip enable signals CEn0 to CEn3, a command latch enable signal CLE, an address latch enable signal ALE, a write enable signal WEn, a differential (or complementary) read enable signals RE and REn, a write protection signal WPn, and a plurality of ready/busy signals, for example, ready/busy signals R/Bn0 to R/Bn3. The I/O signals DQ0 to DQ7 include a command, an address, data, and the like. The I/O signals DQ0 to DQ7, when not distinguished from one another, are referred to as an I/O signal DQx. For high-speed processing, the data strobe signal and the read enable signal are set to be differential signals, but may be single-ended signals that are the same as other signals. In the embodiment, on the user side, using a Set Feature that is a parameter setting sequence, which will be described below, whether the data strobe signal and the read enable signal are the differential signals or the single-ended signals can be designated. The individual chip enable signals CEn0 to CEn3 and the individual ready/busy signals R/Bn0 to R/Bn3, when not distinguished from one another, are referred to as a chip enable signal CEnx and a ready/busy signal R/Bnx, respectively. The number of individual chip enable signals CEn is set to three and the number of the ready/busy signals R/Bn is set to three, but they are not limited to three, and each may be a different number.

As signals, there are a high active (positive logic) signal and a low active (negative logic) signal. Normally, the low active signal is expressed by normally adding an over-line (a slip line) to a symbol representing a signal as illustrated in the accompanying drawings in the present specification, but is expressed by placing "n" after a symbol for the convenience of description in the present specification. For example, the chip enable signal CEn means a signal that is at a low level when the core chip 108 is enabled, and a negative logic signal that is at a high level when the core chip 108 is disabled. Normally, any one of the positive logic signal and the negative logic signal is used, but for the data strobe signal and the read enable signal, complementary signals with positive logic and negative logic are used.

The signals described above are communicated along signal transfer paths for two channels, respectively, between the controller 104 and the IF chip 106. The IF chip 106 includes as many interfaces as is required for two channels. In a case where two channels are used, the IF chip 106 can designate a channel that corresponds to each core chip under the control of the controller 104. The IF chip 106 includes an RZQ terminal to which an external resistor for ZQ calibration is connected. The Zero Quotient (ZQ) calibration will be described in detail in a third embodiment. A voltage Vref is supplied from the controller 104 to the IF chip 106. However, the IF chip 106 may generate the voltage Vref inside. In the embodiment, internal generation or external input can be designated on the user side, using a Set Feature sequence.

IF Chip

Figure 3:
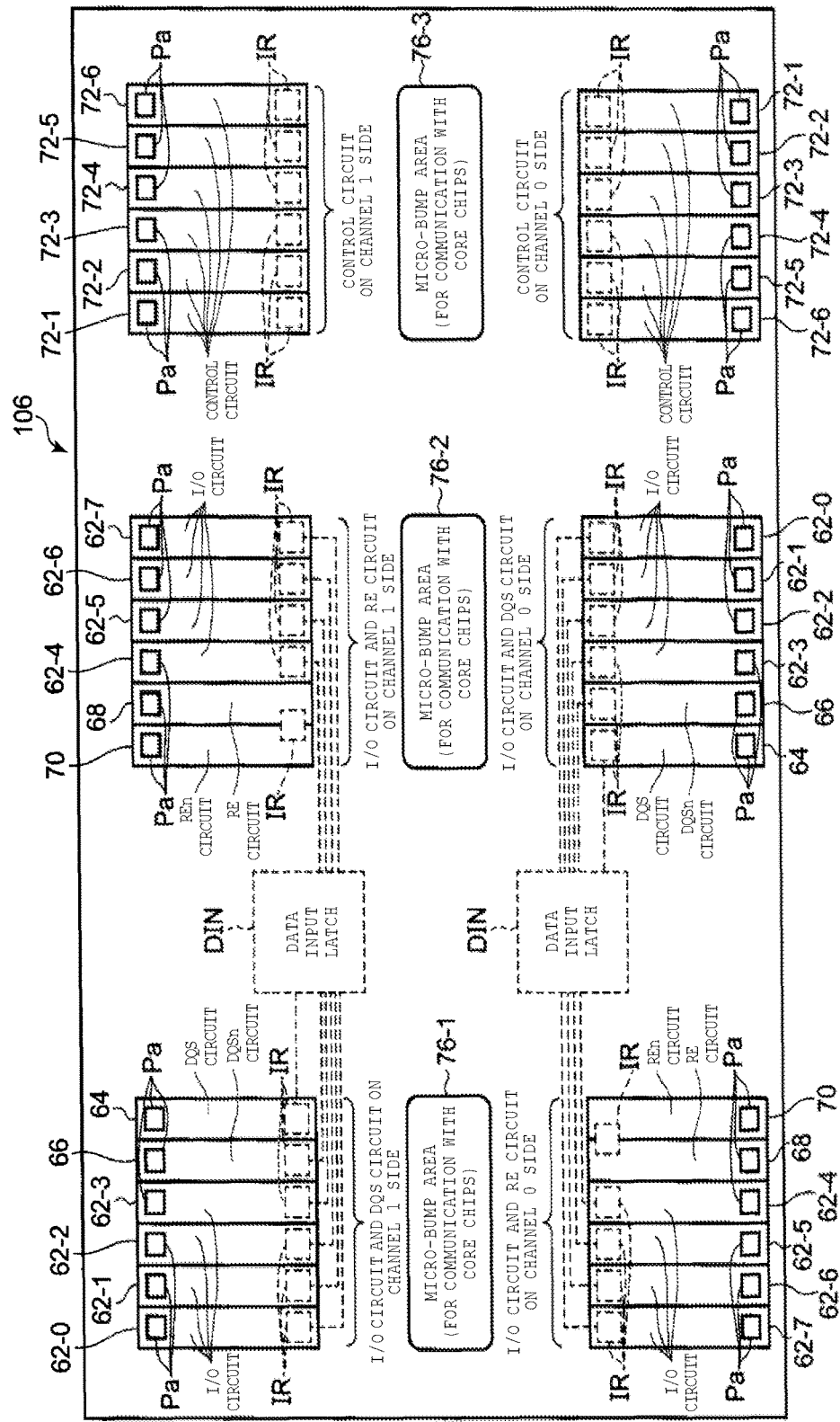
FIG. 3 is a diagram illustrating an example of a correspondence relationship between a pad of an IF chip and an internal circuit of the semiconductor memory device according to the embodiment.

FIG. 3 illustrates an example of a correspondence relationship between the pad of the IF chip 106 and an internal circuit. The pad and the internal circuit are provided for each channel.

First, a first channel CH0 is described. I/O circuits 62-0 to 62-7 have pads Pa and input receivers IR, respectively. The I/O circuits 62-0 to 62-7, when not distinguished from one another, are referred to as an I/O circuit 62. The pad Pa inputs and outputs the I/O signal DQx in the first channel CH0 to the controller 104. The input receiver IR receives an I/O signal that is input from the first channel CH0 of the controller 104 through the pad Pa. The pad Pa is formed on a chip surface (a surface that is in contact with the solder ball 28 of the IF chip 14 in FIG. 1) of the IF chip 106.

A DQS circuit 64 and a DQSn circuit 66 each have the pad Pa and the input receiver IR. Through each of the pads Pa, it is possible that the data strobe signals DQS and DQSn in the first channel CH0 are input and output from and to the controller 104. The input receiver IR receives the data strobe signals DQS and DQSn that are input through each of the pads Pa.

An RE circuit 68 and an REn circuit 70 each have the pad Pa and the input receiver IR. Through each of the pads Pa, the read enable signals RE and REn in the first channel CH0 are input and output from and to the controller 104. The input receiver IR receives the read enable signals RE and REn that are received through the pads Pa.

With wiring, a data input latch DIN in the first channel CH0 is connected to the input receiver IR of each of the I/O circuits 62-0 to 62-7, the DQS circuit 64, and the DQSn circuit 66.

Six control circuits 72-1 to 72-6 have the pad Pa and the input receiver IR. Though each of the pads Pa, a control signal in the first channel CH0 is input and output from and to the controller 104. The input receivers IR receive signals that are input through these pads Pa, respectively.

The control circuit 72-1 inputs and outputs the chip enable signal CEnx, the control circuit 72-2 inputs and outputs the command latch enable signal CLE, the control circuit 72-3 inputs and outputs the address latch enable signal ALE, the control circuit 72-4 inputs and outputs the write enable signal WEn, the control circuit 72-5 inputs and outputs the write protection signal WPn, and the control circuit 72-6 inputs and outputs the ready/busy signal R/Bnx. The control circuits 72-0 to 72-7, when not distinguished from one another, are referred to as a control circuit 72.

As described above, because the chip enable signal CEnx includes four individual chip enable signals CEn0 to CEn3, one chip enable signal is illustrated in FIG. 3, but the control circuit 72-1 has four pads Pa. Because the ready/busy signal R/Bnx includes four individual ready/busy signals R/Bn0 to R/Bn3, one ready/busy signal is illustrated in FIG. 3, but the control circuit 72-6 has four pads Pa.

Micro bumps (which correspond to the solder balls 28-2 and 28-3 in FIG. 1) are formed on the pad Pa, and the IF chip 106 and the controller 104 are electrically connected to each other through these micro bumps. The IF chip 106 and the core chip 108 are electrically connected to each other through micro bumps (not illustrated) that are disposed in micro-bump areas 76-1 to 76-3 (which correspond to the solder balls 28-1 to 28-3, respectively in FIG. 1).

In the same manner, the pad Pa, the input receiver IR, and each circuit are provided to a second channel CH1.

Figure 4A:
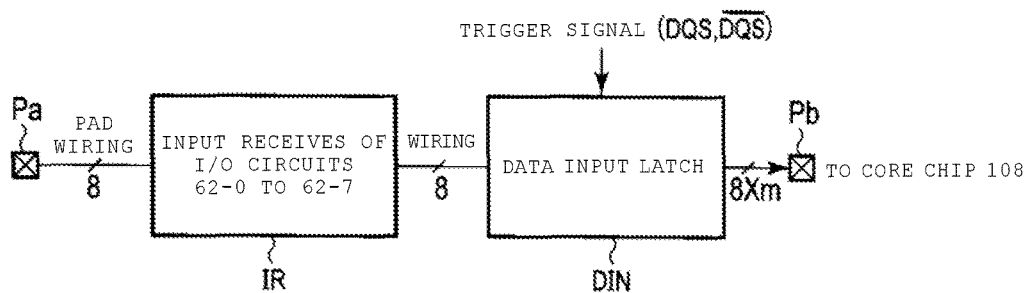
FIGS. 4A and 4B are diagrams illustrating an example of wiring between the pad and the internal circuit in the IF chip of the semiconductor memory device according to the embodiment.
Figure 4B:
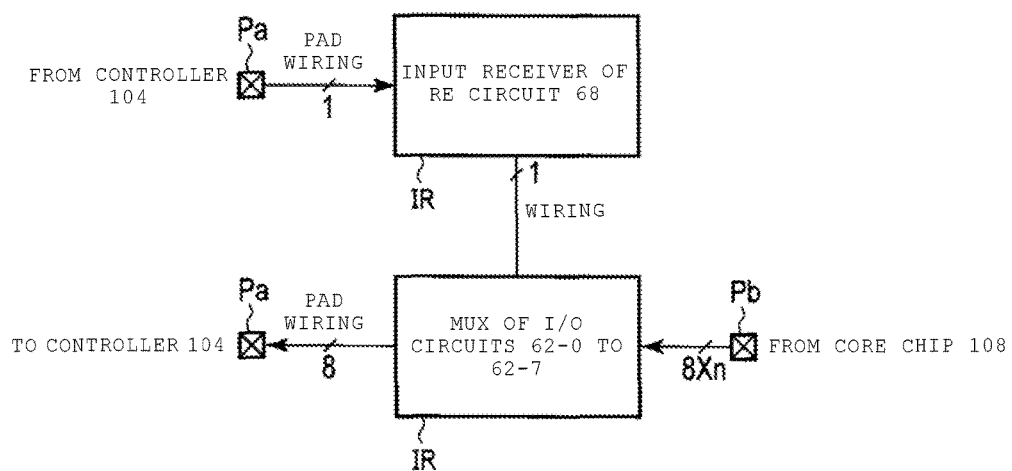

FIGS. 4A and 4B illustrate an example of pad wiring of the IF chip 106. FIG. 4A relates to an input IF to the core chip 108, and illustrates wiring between the input receiver IR and the data input latch DIN of each of the I/O circuits 62-0 to 62-7. The pad Pa and the input receiver IR of each of the I/O circuits 62-0 to 62-7 are connected to each other with 8-bit pad wiring. The input receiver IR and the data input latch DIN are connected to each other with the 8-bit wiring.

The data strobe signals DQS and DQSn that are sent from the controller 104 are input as trigger signals into the data input latch DIN. The data input latch DIN is connected to a pad Pb that corresponds to the micro-bump areas 76-1 and 76-2, and latches the I/O signal DQx that is received in the input receiver IR of each of the I/O circuits 62-0 to 62-7, based on trigger signals DQS and DQSn that are input.

Data that is latched into the data input latch DIN is output to the core chip 108 through the pad Pb that is disposed in each of the micro-bump areas 76-1 and 76-2. 8×m bit data (m is any integer) is output to the core chip 108.

FIG. 4B illustrates pad wiring from the core chip 108 to an output IF. The pad Pa of the RE circuit 68 and the input receiver IR of the RE circuit 68 are connected to each other with one bit pad wiring. The input receiver IR of the RE circuit 68 and a multiplexer MUX of each of the I/O circuits 62-0 to 62-7 are connected to each other with one bit internal wiring. The multiplexer MUX of each of the I/O circuits 62-0 to 62-7 is connected to the pad Pb that is disposed in each of the micro-bump areas 76-1 and 76-2 and is connected to the pad Pa of each of the I/O circuits 62-0 to 62-7 through 8-bit pad wiring. The multiplexer MUX selects data that is read from the core chip 108, based on the read enable signal RE from the input receiver IR of the RE circuit 68. For example, 8×n bit data (n is any integer) is output from the core chip 108.

Although not illustrated, based on the read enable signal RE from the input receiver IR of the RE circuit 68, the data strobe signals DQS and DQSn are generated in multiplexers within the DQS circuit 64 and the DQSn circuit 66. The generated data strobe signals DQS and DQSn are output to the controller 104 through the pad Pa of each of the DQS circuit 64 and the DQSn circuit 66. With an output driver that is driven by a pre-driver, read data that is selected in the multiplexer MUX of each of the I/O circuits 62-0 to 62-7 is output to the controller 104 through the pad Pa of each of the I/O circuits 62-0 to 62-7 at a double data rate, using a falling edge of each of the data strobe signals DQS and DQSn that are generated in the IF chip 106.

Circuit Configurations of the IF Chip and the Core Chip

Figure 5:
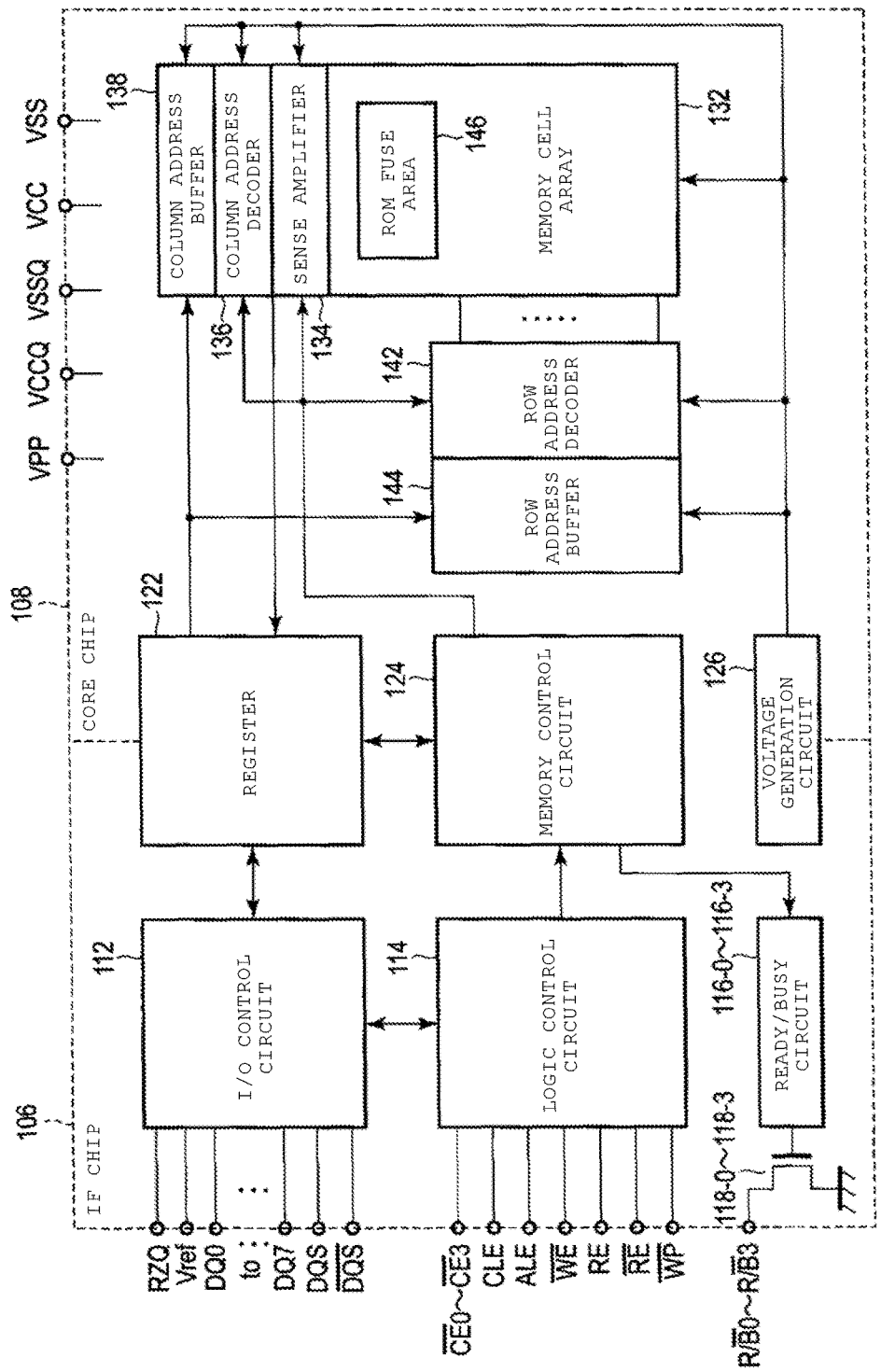
FIG. 5 is a block diagram illustrating an example of a circuit configuration of the IF chip and a core chip of the semiconductor memory device according to the embodiment.

FIG. 5 is a block diagram illustrating an example of a circuit configuration of the IF chip 106 and the core chip 108. FIG. 5 illustrates an example in which there is one channel to the controller 104 and in which there is one core chip 108. In FIG. 2, a configuration of the IF chip 106 in FIG. 5 would be for two channels and a configuration of the core chip 108 would be for sixteen chips. A register 122 and a memory control circuit 124 are divided into two registers, first and second registers, and two memory control circuits, first and second control circuits, respectively. The first register and the first memory control circuit are disposed in the IF chip 106, and the second register and the second memory control circuit are disposed in the core chip 108. Information relating to operation of the IF chip 106 is stored in the first register, and information relating to operation of the core chip 108 is stored in the second register. A voltage generation circuit 126 is disposed within the IF chip 106, and generates one portion of a voltage that is needed within the IF chip 106 and of a voltage that is needed by the core chip 108. The memory control circuit 124 performs control according to the register 122. Control that is based on the information which is stored in the first register is performed by the first memory control circuit, and control that is based on the information which is stored in the second register is performed by the second memory control circuit.

A voltage Vref that is supplied from the controller 104 is a reference voltage for determining whether an input signal is H or L. Various power source voltages Vpp, VccQ, VssQ, Vcc, and Vss that are necessary for the IF chip 106 and the core chip 108 are supplied directly from the outside.

The IF chip 106 includes an input and output (I/O) control circuit 112, a logic control circuit 114, a ready/busy circuit 116, a MOS transistor 118. The ready/busy circuit 116 and the MOS transistor 118 correspond to a plurality of ready/busy signals R/Bn0 to R/Bn3, and are configured with a plurality of ready/busy circuits 116-0 to 116-3 and MOS transistors 118-0 to 118-3, respectively. An I/O control circuit 112 corresponds to the I/O circuit 62, the DQS circuit 64, and the DQSn circuit 66 in FIG. 3, includes the RZQ terminal and a Vref terminal for ZQ calibration, and inputs and outputs the I/O signal DQx, the data strobe signals DQS, and DQSn. The logic control circuit 114 corresponds to the control circuit 72, the RE circuit 68, and the REn circuit 70 in FIG. 3, and inputs and outputs the chip enable signal CEnx, the command latch enable signal CLE, the address latch enable signal ALE, the write enable signal WEn, the write protection signal WPn, the ready/busy signal R/Bnx, and the read enable signals RE and REn. The I/O control circuit 112 and the logic control circuit 114 are connected to each other, and communicates necessary information.

The core chip 108 includes a column address buffer 138, a column address decoder 136, a sense amplifier 134, a memory cell array 132, a row address buffer 144, and a row address decoder 142. When writing data, the I/O signal DQx and the data strobe signals DQS and DQSn are input from the controller 104 to the I/O control circuit 112. The I/O control circuit 112 transfers the I/O signal DQx and the data strobe signals DQS and DQSn that are input, to the register 122. The data strobe signals DQS and DQSn are signals for determining a timing for data writing. When reading data, the I/O signal DQx and the data strobe signals DQS and DQSn that are output from the register 122 are input into the I/O control circuit 112. The I/O control circuit 112 transfers the I/O signal DQx and the data strobe signals DQS and DQSn that are input, to the controller 104. The controller 104 is synchronized to the data strobe signals DQS and DQSn and reads data.

The memory cell array 132 is a well-known NAND flash memory cell array. Although not illustrated, the NAND flash memory cell includes many memory cell blocks that are arranged in the row direction. The memory cell block includes a memory cell that is configured with many MOS transistors which are arranged in the form of an array. The memory cell includes a stacked-layer gate that includes a control gate and an electric charge storage layer, and retains data in a nonvolatile manner. Memory cells in each column are connected in series to each other, and thus a cell string is formed. One end of a cell string in each column (for example, the drain side of the memory cell) is connected to a bit line through a first selection MOS transistor. The bit line is connected to the sense amplifier 134. The other ends of all cell strings (for example, the source side of the memory cell) are connected in a shared manner to a source line through a second selection MOS transistor. Gates of all the first selection MOS transistors are connected in a shared manner to a first select gate line. Gates of all the second selection MOS transistors are connected in a shared manner to the second select gate line. A gate of a memory cell in each row is connected in a shared manner to a word line. The first and second select gate lines and the word line are connected to the row address decoder 142.

The memory cell array 132 includes a ROM fuse area 146.

The register 122 retains various tables for controlling a sequence that is executed based on a command. The register 122 retains a command, an address, and data that are included in the I/O signal DQx. The register 122 transfers an address to the column address buffer 138, the row address buffer 144, and the sense amplifier 134, and transfers the command to the memory control circuit 124.

The row address decoder 142 decodes a row address that is retained in the row address buffer 144, and selects the first and second select gate lines and the word line of the memory cell array 132. The column address decoder 136 decodes a column address that is retained in a column address buffer 144 and selects a bit line of the memory cell array 132.

When writing data, the sense amplifier 134 writes data that is retained in the register 122, to the selected memory cell. When reading data, the sense amplifier 134 reads data from the selected memory cell through the bit line.

An output of the ready/busy circuit 116 that is connected to the memory control circuit 124 is connected to a gate of the MOS transistor 118 of which a drain or a source is grounded. The ready/busy signal R/Bnx is output from the source or the drain of the MOS transistor 118 to the controller 104. The ready/busy circuit 116 notifies the controller 104 of a state of the core chip 108 through a signal R/Bnx. The ready/busy signal R/Bnx is at a high level when the core chip 108 is in a ready state (a state where a command can be received from the outside), and is at a low level when the core chip 108 is in a busy state (a state where a command cannot be received from the outside).

Chip Configuration

According to the present embodiment, a plurality of core chips 108 that are stacked on top of one another are selected by combinations of a plurality of chip enable signals CEn and a plurality of chip addresses. The chip address is assigned to a plurality of core chips in which the chip enable signal is enabled, and thus any core chip of the plurality of core chips can be selected using that chip address. For example, sixteen core chips 108 are selected with four chip addresses when four chip enable signals CEn0 to CEn3 are used, are selected by eight chip addresses when two chip enable signals CEn0 and CEn1, or are selected with sixteen chip addresses when one chip enable signal CEn0. It is also possible that the number of the chip enable signals CEn that are used in the memory system is changed, which is described later.

For example, in a case where the different chip address is provided for each core chip 108, although the chip enable signal CEn is shared, a desired core chip can be selectively enabled. In a case where chip addresses of a plurality of core chips are the same, a desired core chip can be selectively enabled by changing the chip enable signal CEn for each core chip.

It is also possible that the number of the ready/busy signals R/Bn that are used in the memory system is changed as well.

Furthermore, communication between the controller 104 and the IF chip 106 are possible with one channel or two channels, and the number of communication channels is possible changed as well.

In this manner, it is possible that each core chip 108 makes a selection using combination of the number of channels for communication with a controller 105, the number of chip enable signals that are used, the number of ready/busy signals that are used, and the number of chip addresses that are used. In the present specification, these combinations are defined as a chip configuration. It is noted that because the number of chip addresses that are used is determined based on the number of chip enable signals that are used and the number of ready/busy signals that are used, the number of chip addresses that are used may be included in the chip configuration. The core chip 108 is selected in a mode in accordance with the chip configuration. It can be considered that the chip configuration, for example, includes the number of channels, the number of chip enable signals, and the number of ready/busy signals, and various combinations are obtained. At this point, five chip configurations in a case where the number of channels is set to 2, and the number of chip enable signals is set to 4 and ready/busy signals is set to 4, respectively, are described as examples. It is noted that the chip configuration may include the number of chip enable signals and a control signal other than the ready/busy signals.

FIG. 6 illustrates a relationship between the core chip 108 and each of the channel CH, the chip enable signal CEn, the ready/busy signal R/Bn, and the chip address CA in each chip configuration. The ready/busy signal is denoted as "R/B" in other figures, but is denoted as "RB" for convenience in FIG. 6. In FIG. 6, because it is not important whether a signal is a positive logical or a negative logic, a symbol n that denotes the negative logic is omitted.

In a chip configuration A, the number of channels is 2, the number of chip enable signals is 4, and the number of ready/busy signals is 4. Specifically, the core chips 108-0, 108-2, 108-4, 108-6, 108-8, 108-10, 108-12, and 108-14 correspond to the first channel CH0, and the core chips 108-1, 108-3, 108-5, 108-7, 108-9, 108-11, 108-13, and 108-15 correspond to the second channel CH1. A chip enable signal CE0 and a ready/busy signal RB0 are allocated to the core chips 108-0, 108-4, 108-8, and 108-12, a chip enable signal CE1 and a ready/busy signal RB1 are allocated to the core chips 108-1, 108-5, 108-9, and 108-13, a chip enable signal CE2 and a ready/busy signal RB2 are allocated to the core chips 108-2, 108-6, 108-10, and 108-14, and a chip enable signal CE3 and a ready/busy signal RB3 are allocated to the core chips 108-3, 108-7, 108-11, and 108-15.

A chip address CA0 is allocated to the core chips 108-0 to 108-3, a chip address CA1 is allocated to the core chips 108-4 to 108-7, a chip address CA2 is allocated to the core chips 108-8 to 108-11, and a chip address CA3 is allocated to the core chips 108-12 to 108-15.

In a chip configuration B, the number of channels to be used is 2, the number of chip enable signals is 2, and the number of ready/busy signals is 2. Specifically, the core chips 108-0, 108-2, 108-4, 108-6, 108-8, 108-10, 108-12, and 108-14 correspond to the first channel CH0, and the core chips 108-1, 108-3, 108-5, 108-7, 108-9, 108-11, 108-13, and 108-15 correspond to the second channel CH1. The chip enable signal CE0 and the ready/busy signal RB0 are allocated to the core chips 108-0, 108-2, 108-4, 108-6, 108-8, 108-10, 108-12, and 108-14, and the chip enable signal CE1 and the ready/busy signal RB1 are allocated to the core chips 108-1, 108-3, 108-5, 108-7, 108-9, 108-11, 108-13, and 108-15. The chip address CA0 is allocated to the core chips 108-0 and 108-1, the chip address CA1 is allocated to the core chips 108-2 and 108-3, the chip address CA2 is allocated to the core chips 108-4 and 108-5, the chip address CA3 is allocated to the core chips 108-6 and 108-7, the chip address CA4 is allocated to the core chips 108-8 and 108-9, the chip address CA5 is allocated to the core chips 108-10 and 108-11, the chip address CA6 is allocated to the core chips 108-12 and 108-13, and the chip address CA7 is allocated to the core chips 108-14 and 108-15.

In a chip configuration C, the number of channels to be used is 1, the number of chip enable signals is 4, and the number of ready/busy signals is 4. Specifically, the core chip 108-0 to 108-15 correspond to the first channel CH0. The chip enable signal CE0 and the ready/busy signal RB0 are allocated to the core chips 108-0, 108-4, 108-8, and 108-12, the chip enable signal CE1 and the ready/busy signal RB1 are allocated to the core chips 108-1, 108-5, 108-9, and 108-13, the chip enable signal CE2 and the ready/busy signal RB2 are allocated to the core chips 108-2, 108-6, 108-10, and 108-14, and the chip enable signal CE3 and the ready/busy signal RB3 are allocated to the core chips 108-3, 108-7, 108-11, and 108-15. The chip address CA0 is allocated to the core chips 108-0 to 108-3, the chip address CA1 is allocated to the core chips 108-4 to 108-7, the chip address CA2 is allocated to the core chips 108-8 to 108-11, and the chip address CA3 is allocated to the core chips 108-12 to 108-15.

In a chip configuration D, the number of channels to be used is 1, the number of chip enable signals is 2, and the number of ready/busy signals is 2. Specifically, the core chips 108-0 to 108-15 correspond to the first channel CH0. The chip enable signal CE0 and the ready/busy signal RB0 are allocated to the core chips 108-0, 108-2, 108-4, 108-6, 108-8, 108-10, 108-12, and 108-14, and the chip enable signal CE1 and the ready/busy signal RB1 are allocated to the core chips 108-1, 108-3, 108-5, 108-7, 108-9, 108-11, 108-13, and 108-15. The chip address CA0 is allocated to the core chips 108-0 and 108-1, the chip address CA1 is allocated to the core chips 108-2 and 108-3, the chip address CA2 is allocated to the core chips 108-4 and 108-5, the chip address CA3 is allocated to the core chips 108-6 and 108-7, the chip address CA4 is allocated to the core chips 108-8 and 108-9, the chip address CA5 is allocated to the core chips 108-10 and 108-11, the chip address CA6 is allocated to the core chips 108-12 and 108-13, and the chip address CA7 is allocated to the core chips 108-14 and 108-15.

In a chip configuration E, the number of channels to be used is 1, the number of chip enable signals is 1, and the number of ready/busy signals is 1. Specifically, the first channel CH0 corresponds to the core chip 108-0 to 108-15. The chip enable signal CE0 and the ready/busy signal RB0 are allocated to the core chips 108-0 to 108-15. The chip addresses CA0 to CA15 are allocated to the core chips 108-0 to 108-15.

Many solder balls, for example, 152 solder balls, are provided in row A to row U, and in column 1 to column 13, on the package substrate 12, a pin assignment of solder balls is determined according to the chip configuration. FIGS. 7 to 11 illustrate examples of the pin assignment on the package substrate 12 in the chip configurations A to E, respectively. The solder ball is not formed in column 7. A row U side area (the bottom area depicted in FIG. 7) is an area for the first channel CH0, and a row A side area is an area for the second channel CH1 (the top area depicted in FIG. 7). In column 1 to column 6, the area for the second channel CH1 ranges from row A to row H, and the area for the first channel CH0 ranges from row J to row U. In column 8 to column 13, the area for the second channel CH1 ranges from row A to row J, and the area for the first channel CH0 ranges from row K to row U. In FIGS. 7 to 11, the ready/busy signal is different from those in other figures, and is denoted as "RB" for convenience. Because it is not important to depict whether a signal is a positive logic signal or a negative logic signal in FIGS. 7 to 11, a symbol n that denotes the negative logic is omitted.

Figure 7:
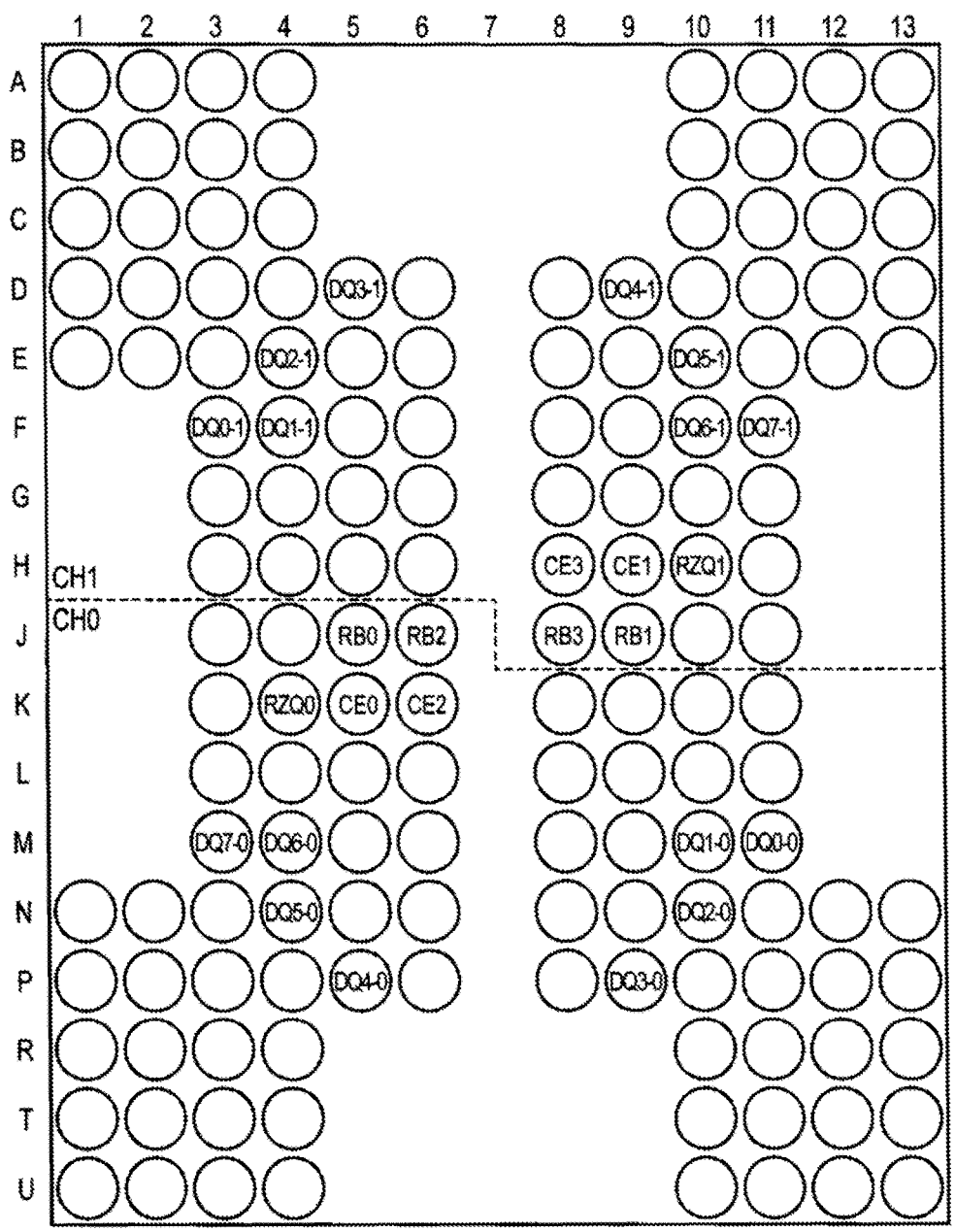
FIG. 7 is a diagram illustrating an example of a pin assignment on a package substrate according to a first chip configuration.

A pin assignment that is illustrated in FIG. 7 corresponds to the chip configuration A. In this pin assignment, an I/O signal DQx-0, two chip enable signals CE0 and CE2, two ready/busy signals RB0 and RB2 are allocated to a solder ball in the area for the first channel CH0. RZQO is a ball to which an external resistor for the ZQ calibration in the first channel CH0 is connected. An I/O signal DQx-1, two chip enable signals CE1 and CE3, and two ready/busy signals RB1 and RB3 are allocated to a solder ball in the area for the second channel CH1. RZQ1 is a ball to which an external resistor for the ZQ calibration in the second channel CH1 is connected. Other control signals, various power sources, NU (defined below), and NC (defined below) are allocated to white circles, within each of which a signal name is not written. Other control signals include the command latch enable signal CLE, the address latch enable signal ALE, the write enable signal WEn, the write protection signal WPn, and the like. Various power sources include Vpp, VccQ, VssQ, Vcc, Vss, and the like. NU (which stands for "Not Used") is a terminal that is connected to ground or a power source within the package, or is used as a test signal, and is a solder ball, a connection to which the user does not request. NC (which stands for "Not Connected") is a terminal that has no connection within the package, and is open-ended in order to prevent a malfunction.

Figure 8:
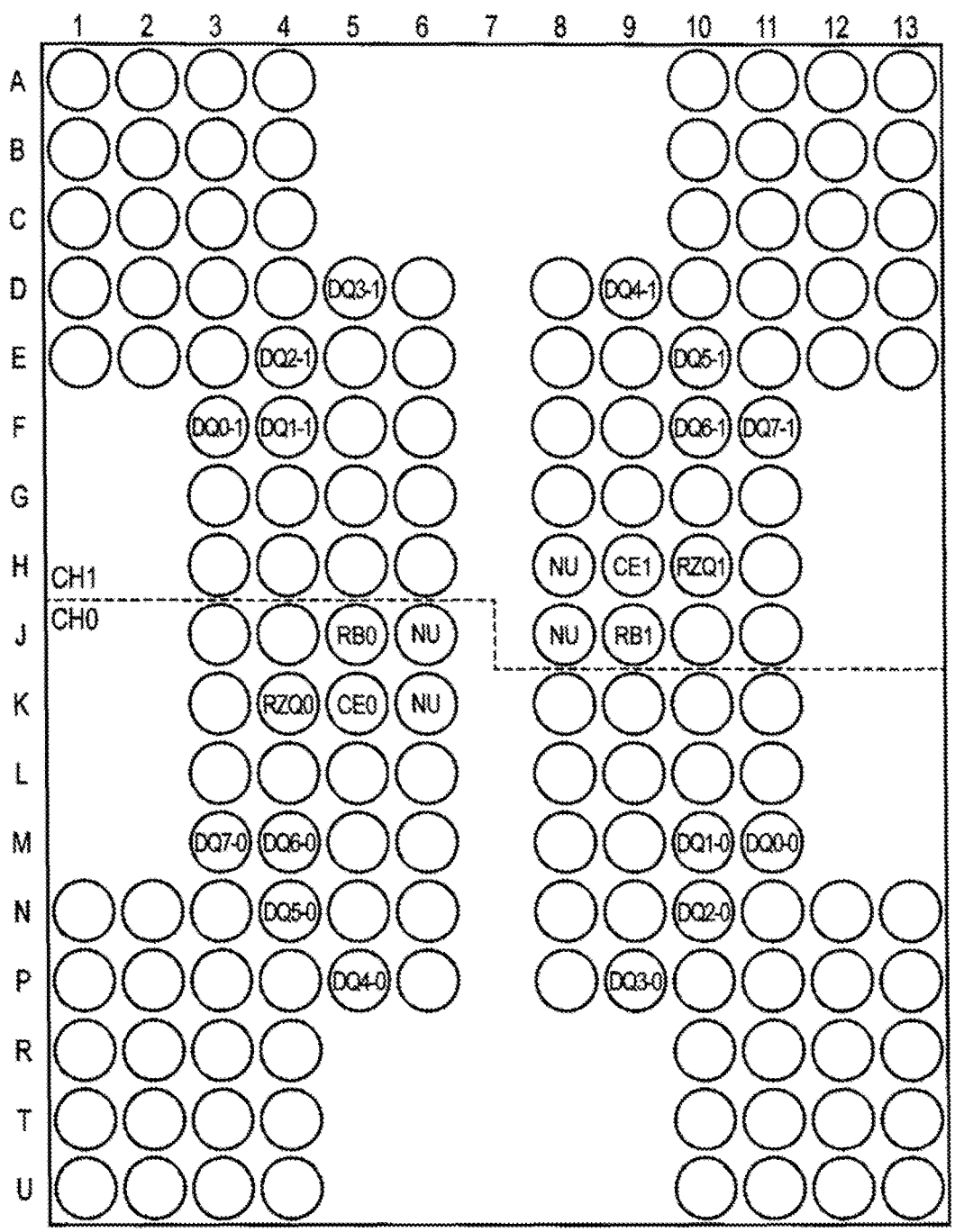
FIG. 8 is a diagram illustrating an example of the pin assignment on the package substrate according to a second chip configuration.

A pin assignment that is illustrated in FIG. 8 corresponds to the chip configuration B. The chip configuration B is different from the chip configuration A, in the number of chip enable signals and the number of ready/busy signals. Each of the number of chip enable signals and the number of ready/busy signals is two per channel in the chip configuration A, but is one per channel in the chip configuration B. The pin assignment in the chip configuration B differs from the pin assignment in the chip configuration A in that a solder ball in row K and column 6 to which the chip enable signal CE2 in the first channel CH0 is allocated, a solder ball in row J and column 6 to which the ready/busy signal RB2 is allocated, a solder ball in row H and column 8 to which the chip enable signal CE3 in the second channel CH1 is allocated, and a solder ball in row J and column 8 to which the ready/busy signal RB3 is allocated, are NU terminals.

Chip configurations C, D, and E do not use the second channel CH1, and so a solder ball in the area for the second channel CH1 to which an I/O signal is allocated in the chip configurations A and B is an NU terminal in the chip configurations C, D, and E.

Figure 9:
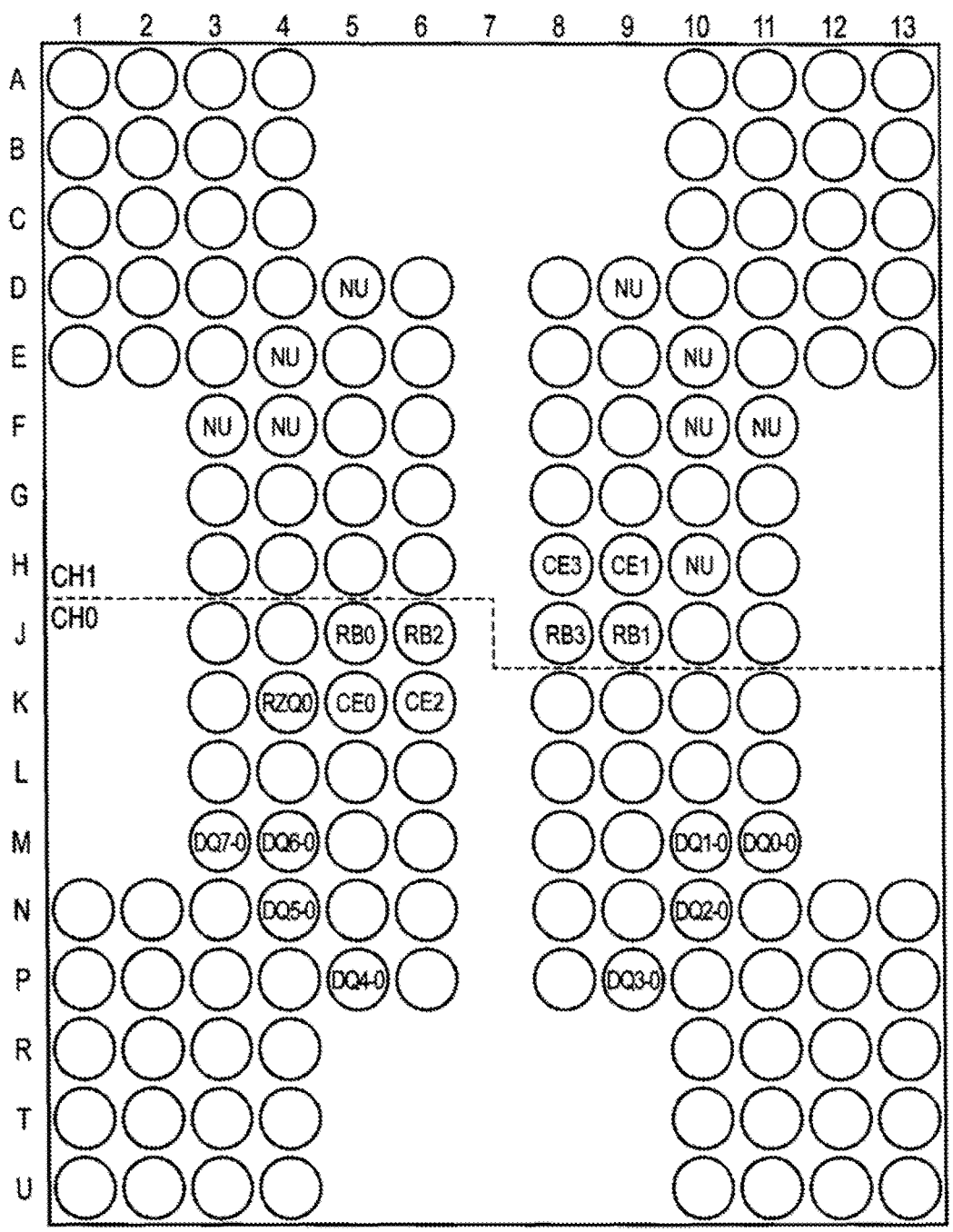
FIG. 9 is a diagram illustrating an example of the pin assignment on the package substrate according to a third chip configuration.

A pin assignment that is illustrated in FIG. 9 corresponds to the chip configuration C. In this pin assignment, the I/O signal DQx-0, the two chip enable signals CE0 and CE2, the two ready/busy signals RB0 and RB2, and the RZQO terminal are allocated to the solder balls in the area for the first channel CH0.

Figure 10:
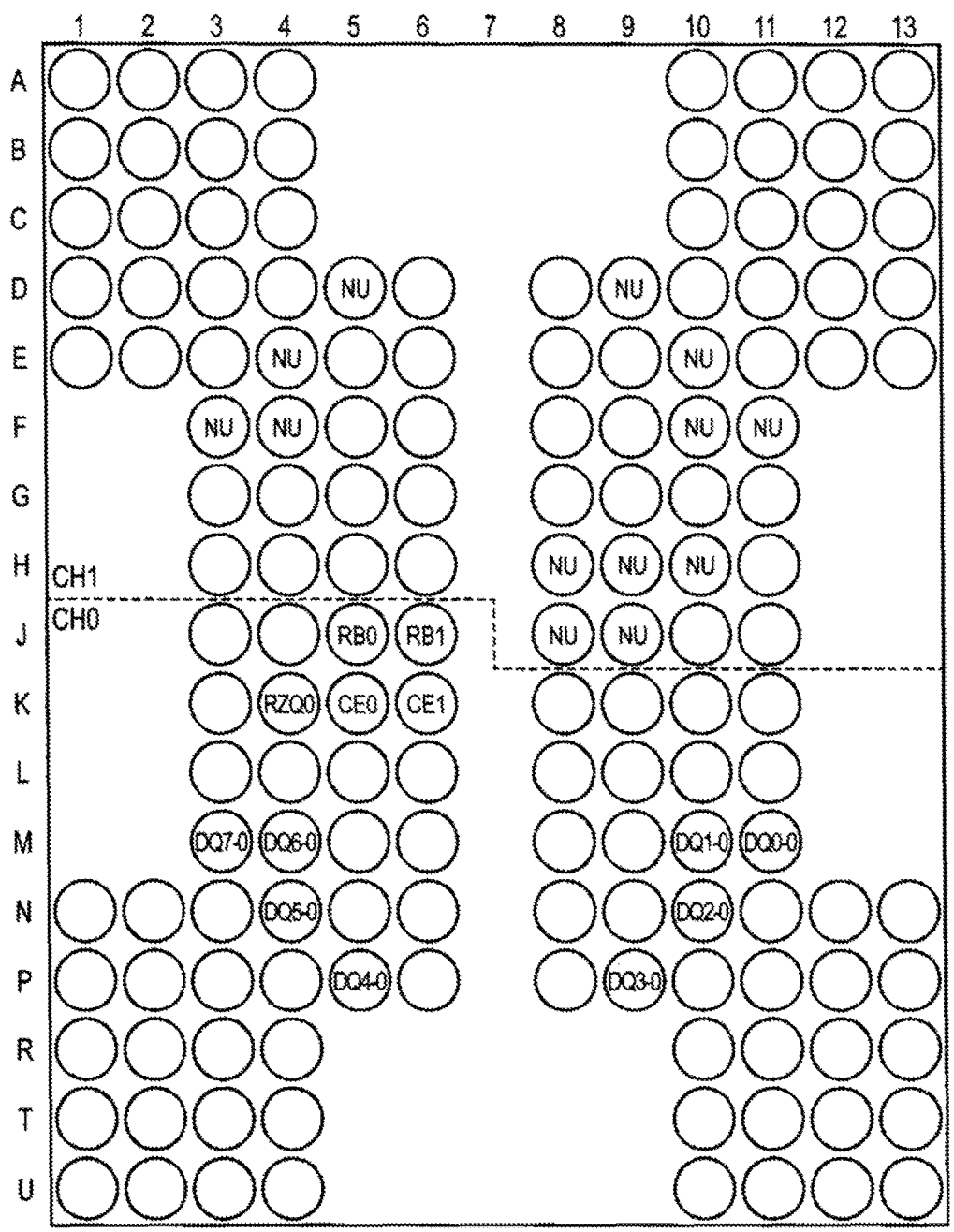
FIG. 10 is a diagram illustrating an example of the pin assignment on the package substrate according to a fourth chip configuration.

A pin assignment that is illustrated in FIG. 10 corresponds to the chip configuration D. The chip configuration D is different from the chip configuration C in the number of chip enable signals and the number of ready/busy signals. Each of the number of chip enable signals and the number of ready/busy signals is four in the chip configuration C, but is two in the chip configuration D. The pin assignment in the chip configuration D differs from the pin assignment in the chip configuration C that is illustrated in FIG. 9 in that the chip enable signal CE1 is allocated to the solder ball in row K and column 6 instead of the chip enable signal CE2, and the ready/busy signal RB1 is allocated to the solder ball in row J and column 6 instead of the ready/busy signal RB2.

Figure 11:
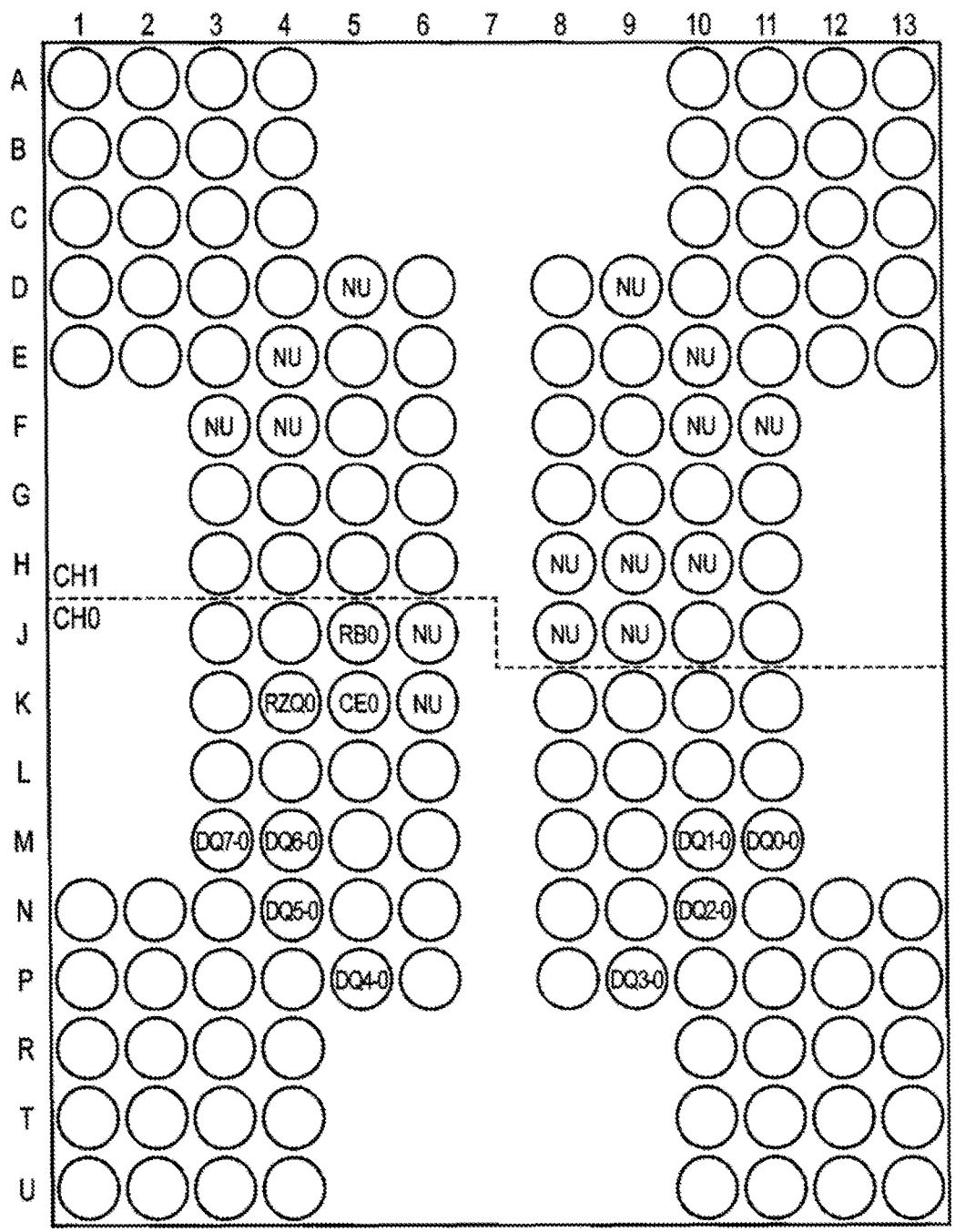
FIG. 11 is a diagram illustrating an example of the pin assignment on the package substrate according to a fifth chip configuration.

A pin assignment that is illustrated in FIG. 11 corresponds to the chip configuration E. The chip configuration E is different from the chip configuration D in the number of chip enable signals and the number of ready/busy signals. Each of the number of chip enable signals and the number of ready/busy signals is two in the chip configuration D, but is one in the chip configuration E. The pin assignment in the chip configuration E differs from the pin assignment in the chip configuration D in that the solder ball in row K and column 6 to which the chip enable signal CE1 is allocated, and the solder ball in row J and column 6 to which the ready/busy signal RB1 is allocated, are NU terminals.

Operation of Setting Chip Configuration

When the memory system is designed, the chip configuration is determined according to a specification that is requested by the user, and the controller 104 transmits a signal indicating the chip configuration to the IF chip 106. The signal is transferred to the IF chip 106 through the package substrate 12. Each solder ball 22 on the package substrate 12 is connected to each pad of the IF chip. A pin assignment of solder balls 22 on the package substrate 12 changes with the chip configuration. In a case where the chip configuration changes, the controller 104 recognizes the pin assignment of the solder balls 22 on the package substrate 12, and so a signal in accordance with the chip configuration can be transmitted and received to and from a predetermined solder ball 22 on the package substrate 12, but the IF chip 106 does not recognize the change in the chip configuration. In the present embodiment, when the user powers on the semiconductor memory device, information (hereinafter referred to as chip configuration information) indicating the chip configuration as illustrated in FIG. 6 is sent from the controller 104 to the IF chip 106, and it is possible for the IF chip 106 to operate according to the chip configuration information. This is referred to as setting of the chip configuration.

Figure 12:
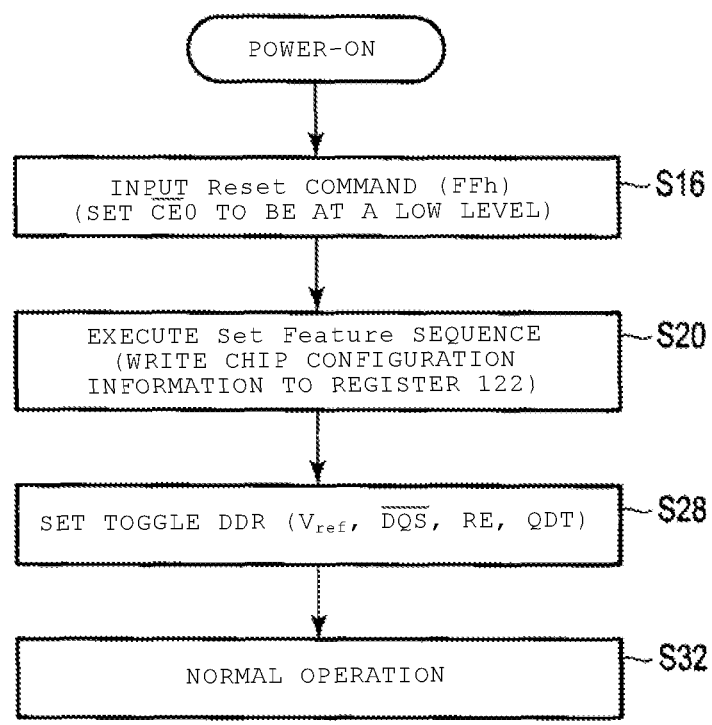
FIG. 12 is a flowchart illustrating a process of setting a chip configuration according to the embodiment.

FIG. 12 is a flowchart illustrating an example of an operation of setting the chip configuration. When the memory system 100 is powered on, power source voltages Vpp, VccQ, VssQ, Vcc, and Vss rise. It is noted that a default chip configuration is assumed to be the chip configuration E in FIG. 11.

In S16, the controller 104 sets the chip enable signal CEn0 to be a low level (which is the activation level), supplies a reset command (FFh) to the IF chip 106 through the first channel CH0, and causes power-on reset to be performed.

In S20, the controller 104 executes the parameter setting sequence that is called the Set Feature. In the NAND flash memory, there is the parameter setting sequence that is called the Set Feature for setting a parameter for enabling a memory function, and a parameter reading sequence that is called a Get Feature for reading a parameter indicating a state of the memory function as to whether it is enabled or disabled. These sequences, for example, are used in order to enable input of the read enable signals RE and REN or the like for high-speed data transfer, and so forth.

Figure 13:
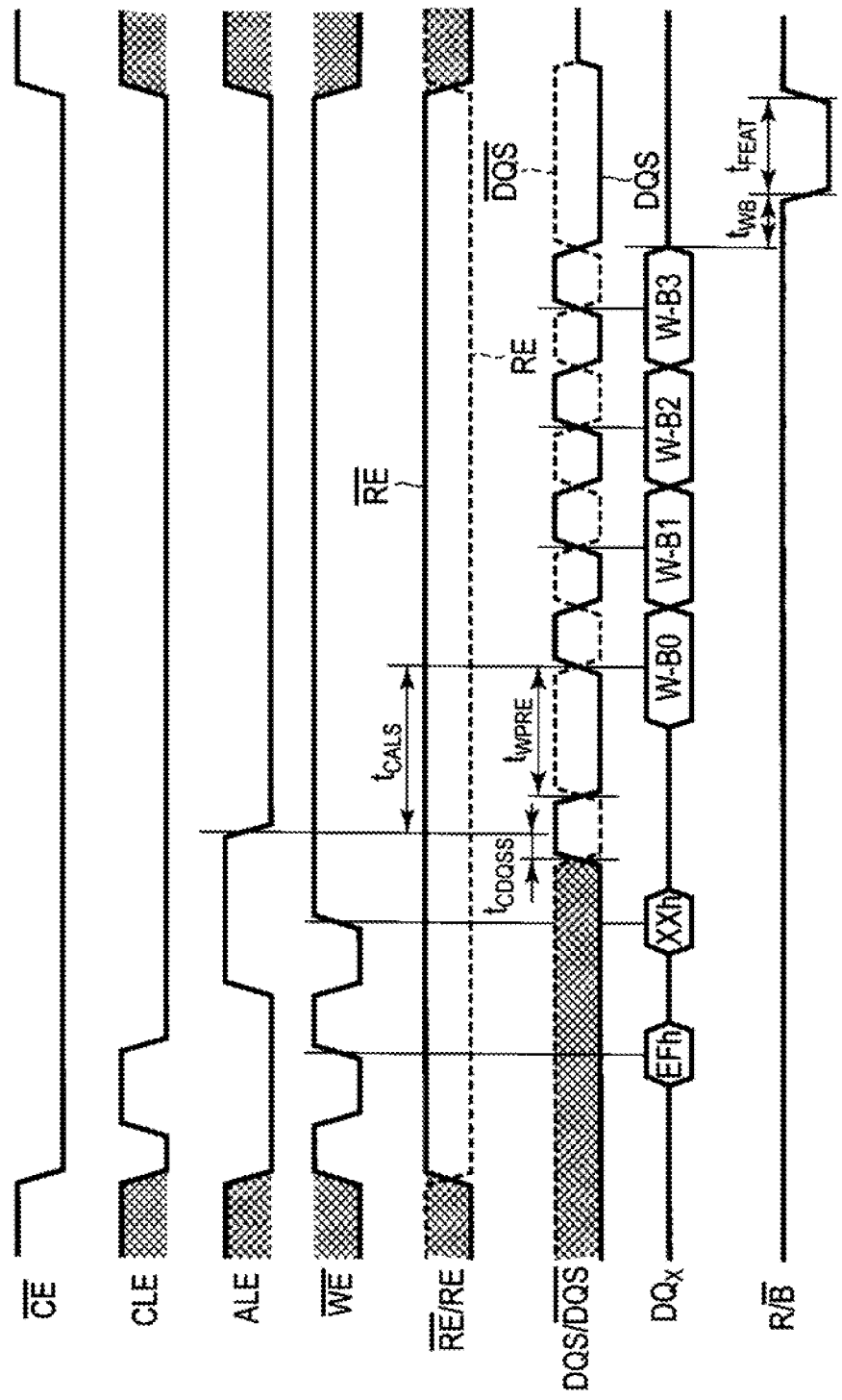
FIG. 13 is a timing chart illustrating an example of a parameter setting sequence, which is used in the process of setting the chip configuration.

An example of the Set Feature sequence is illustrated in FIG. 13. The chip enable signal CE is activated, the command latch enable signal CLE and the address latch enable signal ALE are deactivated, the write enable signal WEn is deactivated, and the read enable signal RE is activated. Thereafter, the command latch enable signal CLE and the write enable signal WEn are activated, "EFh" is transferred with the I/O signal DQx. In a state of being synchronized to a falling edge of the command latch enable signal CLE and a rising edge of the write enable signal WEn, "EFh" that is the I/O signal DQx is input into the IF chip 106 as a command. A command EFh indicates a command to start the Set Feature sequence. The Set Feature sequence is for causing pieces of data W-B0, W-B1, W-B2, and W-B3 to be written to an address "XXh" of the register 122.

The address latch enable signal ALE and the write enable signal WEn are activated, and "XXh" is transferred with the I/O signal DQx. In a state of being synchronized to the rising edge of the write enable signal WEn, "XXh" that is the I/O signal DQx is input into the IF chip 106 as an address. Thereafter, the address latch enable signal ALE is deactivated, and W-B0, W-B1, W-B2, and W-B3 are transferred with the I/O signal DQx. In a state of being synchronized to toggles of data strobe signals DSQ and DSQn, W-B0, W-B1, W-B2, and W-B3 that are the I/O signals DQx are input into the IF chip 106 as pieces of data, and pieces of data, W-B0, W-B1, W-B2, and W-B3 are written to the address "XXh" of the register 122.

The address "XXh" may indicate an address of the register 122 for storing the chip configuration information, and for example, may be B0h (refer to FIG. 26). The pieces of data, W-B0, W-B1, W-B2, and W-B3 indicate the chip configuration information (the number of channels, the number of chip enable signals, and the number of ready/busy signals). Each of the pieces of data, W-B0, W-B1, W-B2, and W-B3 has eight bits, DQ[7:0]. In a case where the number of channels, the number of chip enable signals, and the number of ready/busy signals are each expressed in two bits, as illustrated in FIG. 26, DQ[1:0], DQ[3:2], and DQ[5:4] of data B0 at an address B0h, may indicate the number of channels, the number of chip enable signals, and the number of ready/busy signals, respectively.

As described above, by the Set Feature sequence, the chip configuration information is stored in the register 122. Thereafter, the IF chip 106 can recognize the terminal configuration of the package substrate 12 as one of terminal configurations in FIGS. 7 to 11, and can select the core chips 108-1 to 108-15 according to any of the chip configurations A to E that are illustrated in FIG. 6.

Returning to FIG. 12, in S28, the controller 104 executes another Set Feature sequence, and writes a parameter relating to a toggle DDR to an address of the register 122, for example, 02h (refer to FIG. 26). The parameter relating to the toggle DDR includes information indicating switching between internal generation and external input of a reference voltage Vref, switching between a differential and a single end of the data strobe signal DQSn, switching between a differential and a single end of each of the read enable signals RE and REn, and an on-die termination (ODT) resistance value indicating a termination resistance value.

Thereafter, in S32, a normal operation that includes access to each core chip 108, is started.

Effects of the First Embodiment

The semiconductor memory device according to the first embodiment includes a plurality of core chips 108 and one IF chip 106 within one package. In the semiconductor memory device, the plurality of core chips 108 are stacked on top of one another and are connected to each other through the through via. It is possible that the plurality of core chips 108 are selected according to the chip configuration. The chip configuration is determined according to a specification that is requested by the user. When the chip configuration is determined, the pin assignment in the package substrate 12 is determined. When the pin assignment is determined, the controller 104 supplies a designated chip enable signal to a predetermined terminal of a package substrate 12 through a designated channel. The controller 104 supplies the chip configuration information to the IF chip 106. Accordingly, the IF chip 106 can recognize the pin assignment on the package substrate 12, and can recognize a designated chip enable signal that is supplied through a predetermined terminal of the package substrate 12, and thus can select a core chip. Furthermore, the chip configuration indicates which ready/busy signal is allocated to which core chip and the IF chip 106 can output the ready/busy signal from a predetermined terminal of the package substrate 12, to which the ready/busy signal for each chip is allocated. Because of this, the controller 104 can recognize whether each core chip 108 is busy or ready, based on the ready/busy signal.

Second Embodiment

Figure 14:
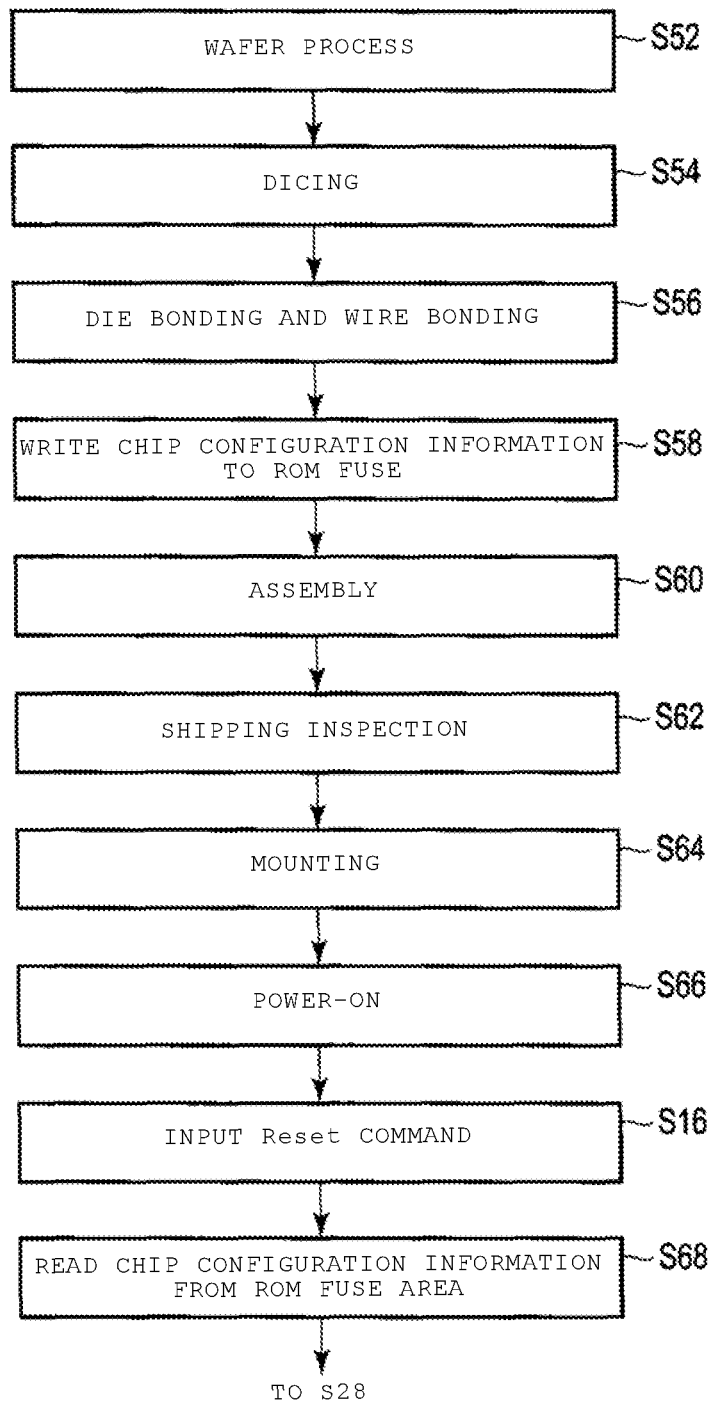
FIG. 14 is a flowchart illustrating a process of setting a chip configuration according to another embodiment.

FIG. 14 is a flowchart illustrating an example of a chip configuration setting operation according to a second embodiment. In the first embodiment, when the memory system 100 is powered on, the chip configuration information is transferred from the controller 104 to the IF chip 106, and the chip configuration is set. That is, on the user side, the chip configuration information is input into the IF chip 106. In the second embodiment, on the manufacturing side, the chip configuration information is written to the core chip 108, and is input from the core chip 108 to the IF chip 106. In the second embodiment, the ROM fuse area 146 of the memory cell array 132 is used. A manufacturer can access the ROM fuse area 146, but the ROM fuse area 146 is an area that is not accessed by the user.

At a semiconductor memory manufacturing state, when a wafer process (S52) is ended, a dicing process is performed in S54, and the wafer is divided into chips. Die boding and wire bonding are performed in S56, and then the chip configuration information (FIG. 6) is written to the ROM fuse area 146 in S58. An IF chip and a core chip are assembled into the semiconductor memory device as illustrated in FIG. 1 in S60, shipping inspection is performed in S62, and then mounting is performed in S64.

On the user side, when the memory system 100 is powered on in S66, the controller 104 issues the reset command (FFh) in S16 and supplies the issued reset command to the IF chip 106. When receiving the reset command, the logic control circuit 114 sets the chip enable signal CEn0 to be a low level.

In the first embodiment, the controller 104 executes the Set Feature sequence after the power-on reset (S20), but in the second embodiment, after the power-on reset, the IF chip 106 reads the chip configuration information from the ROM fuse area 146 within the memory cell array 132 in S68, and writes the chip configuration information that is read, to the register 122.

Subsequent operations, namely S28 and S32, are the same as those in the first embodiment.

As described above, according to the second embodiment, with the Set Feature sequence, on the manufacturer side, the chip configuration information can be written to the ROM fuse area 146 within the memory cell array 132 within the core chip 108, without the chip configuration information being supplied from the controller 104 to the IF chip, can transfer the chip configuration information from the core chip 108 to the IF chip 104, and can cause the chip configuration to be set.

At the manufacturing stage, a place where the chip configuration information is stored is not limited to a ROM fuse, and may be a poly fuse or an e-fuse that is electrically programmable by causing high current to flow. The poly fuse and the e-fuse may be disposed within the core chip 108, for example, the memory control circuit 124.

Third Embodiment

A characteristic of an input and output circuit in the semiconductor memory device varies with a process, a voltage, a temperature (referred to hereinafter as PVT). When the characteristic falls out of a suitable range, high-speed data transfer is difficult. For this reason, there is a need to calibrate the characteristic of the input and output circuit (for example, the I/O circuit 62 in FIG. 3, the I/O control circuit 112 in FIG. 5, or the like). As a method of calibrating the characteristic, the ZQ calibration is proposed. The characteristic of the input and output circuit is determined by on-state resistance Ron of the MOS transistor as a driver for outputting a signal and termination resistance Rtt of an input receiver. The on-state resistance Ron is also referred to as off chip driver (OCD) resistance. Because signal reflection prevents high-speed data transfer, in order to prevent the signal reflection, a termination resistance is connected to the input receiver. The termination resistance Rtt is also referred to as an on-die termination (ODT) resistance.

Figure 15:
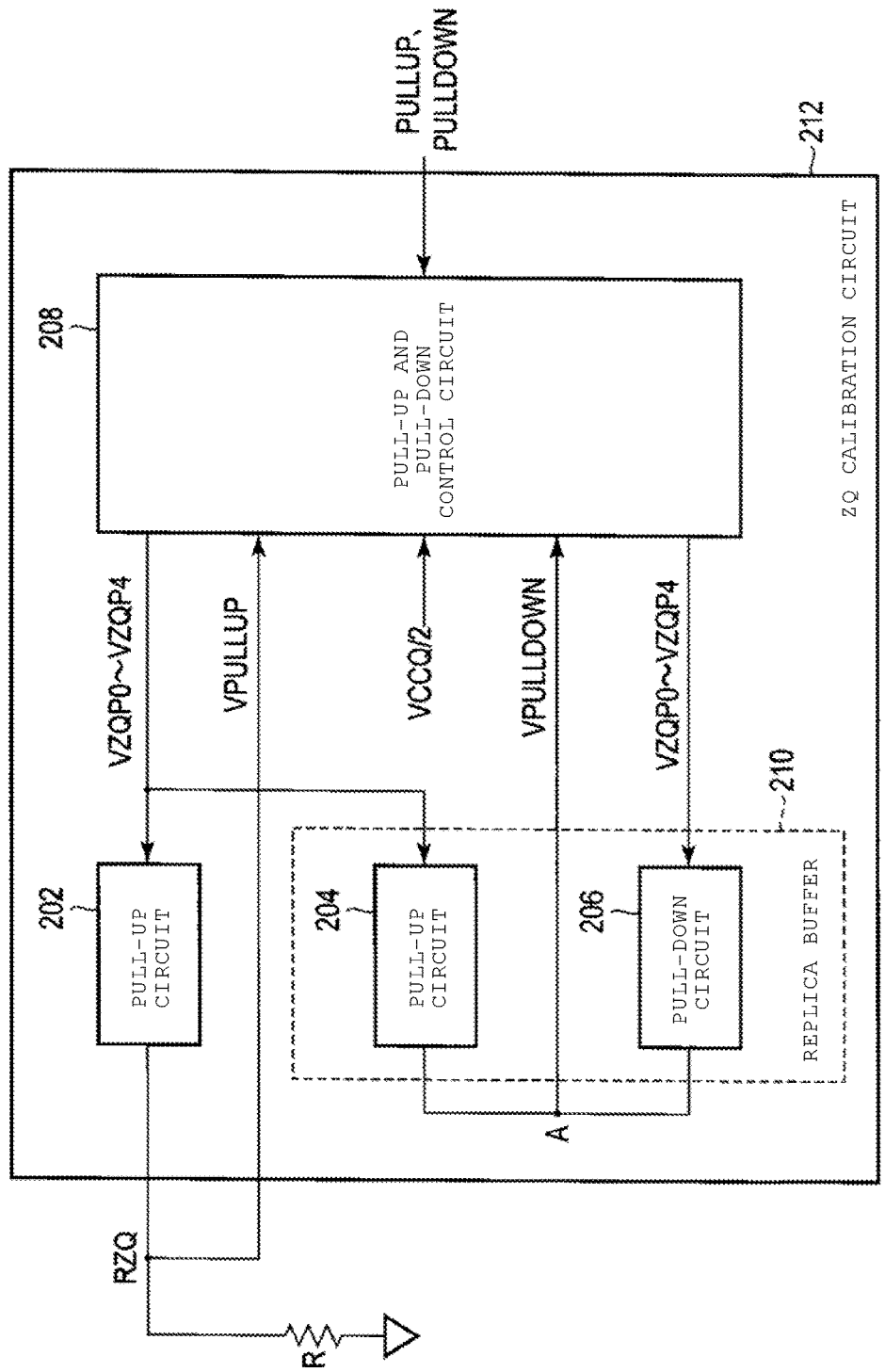
FIG. 15 is a block diagram illustrating an example of a ZQ calibration circuit within an I/O control circuit of a semiconductor memory device according to a third embodiment.

In the third embodiment, for each channel, the I/O control circuit 112 includes ZQ calibration circuit 212 as illustrated in FIG. 15. The ZQ calibration circuit 212 adjusts an on-state resistance and a termination resistance of the I/O circuit 62 in the first channel CH0 of the I/O control circuit 112, using an external resistor R that is connected to a calibration terminal RZQ. As will be described below, the I/O circuit 62 includes a plurality of transistors that are connected in parallel to each other, and the ZQ calibration circuit 212 includes a plurality of transistors that are connected in parallel to each other, and are equivalent to the transistors in the I/O circuit 62. Each of these transistors can be caused to be selectively connected so that the resistance of these transistors takes a desired value. According to this technique, the on-state resistance and the termination resistance of the I/O control circuit 112, that is, the I/O circuit 62, can be adjusted.

The ZQ calibration circuit 212 includes pull-up circuits 202 and 204, a pull-down circuit 206, and a pull-up and pull-down control circuit 208, each of which is configured with a plurality of transistors that are connected in parallel to each other. The pull-up and pull-down control circuit 208 receives signals PULLUP and PULLDOWN from the memory control circuit 124, and controls the pull-up circuits 202 and 204 and the pull-down circuit 206. The pull-up and pull-down control circuit 208 supplies voltages VZQP0 to VZQP4 to a pull-up circuit 202. The pull-up circuit 202 is electrically connected to the RZQ terminal. The RZQ terminal is grounded through a resistor R. A voltage VPULLUP of the RZQ terminal is supplied to the pull-up and pull-down control circuit 208.

A pull-up circuit 204 and the pull-down circuit 206 constitute a replica buffer 210. The pull-up and pull-down control circuit 208 supplies voltages VZQP0 to VZQP4 to the pull-up circuit 204, and supplies voltages VZQN0 to VZQN4 to the pull-down circuit 206. The pull-up circuit 204 and the pull-down circuit 206 are electrically connected to a node A. The voltage VPULLDOWN of the node A is supplied to the pull-up and pull-down control circuit 208.

Figure 16:
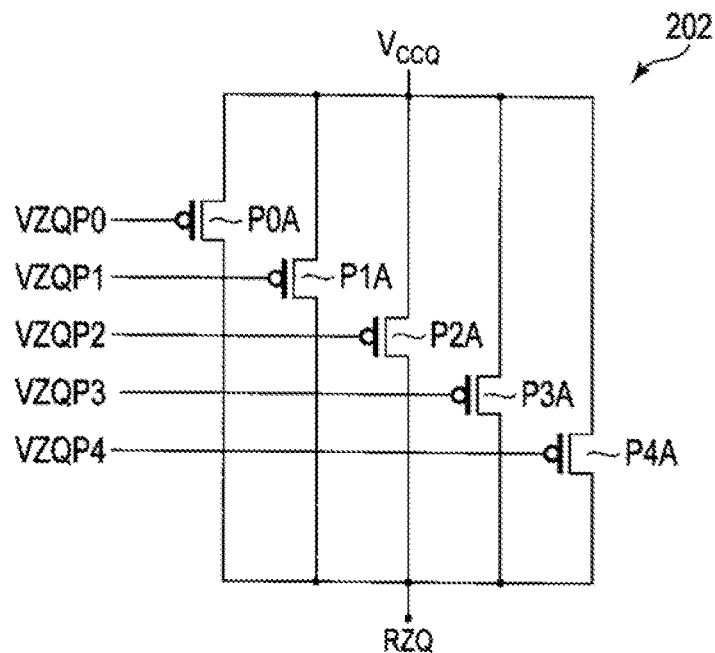
FIG. 16 is a circuit diagram illustrating an example of a first pull-up circuit within the ZQ calibration circuit.
Figure 17:
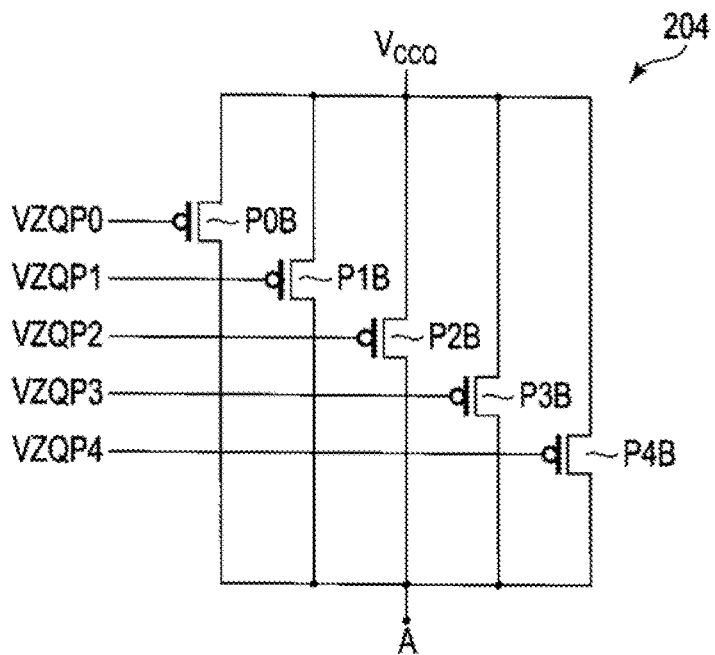
FIG. 17 is a circuit diagram illustrating an example of a second pull-up circuit within the ZQ calibration circuit.
Figure 18:
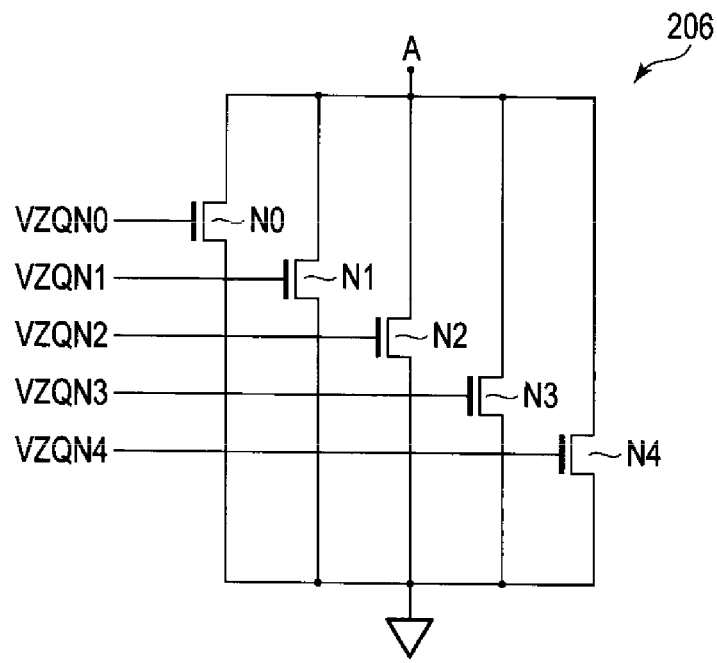
FIG. 18 is a circuit diagram illustrating an example of a pull-down circuit within the ZQ calibration circuit.

FIG. 16 is a circuit diagram of the pull-up circuit 202. FIG. 17 is a circuit diagram of the pull-up circuit 204. FIG. 18 is a circuit diagram of the pull-down circuit 206.

As illustrated in FIG. 16, the pull-up circuit 202 includes PMOS transistors P0A to P4A that are connected in parallel between a power source VCCQ and the calibration terminal RZQ. A voltage VCCQ is supplied to a first terminal (one of a source and a drain) of each of the PMOS transistors P0A to P4A, and a second terminal (the other of a source and a drain) of each of the PMOS transistors P0A to P4A is electrically connected to the RZQ terminal. The voltages VZQP0 to VZQP4 are supplied to gates of the PMOS transistors P0A to P4A, respectively.

As illustrated in FIG. 17, the pull-up circuit 204 includes PMOS transistors P0B to P4B that are connected in parallel between the power source VCCQ and the node A. The voltage VCCQ is supplied to a first terminal (one of a source and a drain) of each of the PMOS transistors P0B to P4B, and a second terminal (the other of a source and a drain) of each of the PMOS transistors P0B to P4B is electrically connected to the node A. The voltages VZQP0 to VZQP4 are supplied to gates of the PMOS transistors P0B to P4B, respectively.

As illustrated in FIG. 18, the pull-down circuit 206 includes NMOS transistors N0 to N4 that are connected in parallel between the node A and a ground terminals. A first terminal (one of a source and a drain) of each of the NMOS transistors N0 to N4 is electrically connected to the node A, and a second terminal (the other of a source and a drain) of each of the NMOS transistors N0 to N4 is grounded. The voltages VZQN0 to VZQN4 are supplied to gates of the NMOS transistors N0 to N4, respectively.

Referring to FIG. 15, the ZQ calibration is performed by connecting the resistor R to the RZQ terminal. The resistor R is configured to have the desired impedance value of each of the I/O circuits 62-0 to 62-7, for example, 300 Ω. In the ZQ calibration, the voltages VZQP0 to VZQP4 are determined in such a manner that the impedance of resistor R and impedance of each of the pull-up circuits 202 and 204 are equal to each other. Moreover, the voltages VZQN0 to VZQN4 are determined in such a manner that the impedance of the pull-down circuit 204 and impedance of the pull-down circuit 206 are equal to each other. The voltages VZQP0 to VZQP4 and VZQN0 to VZQN4, which are obtained, are supplied to the I/O circuits 62-0 and 62-1, and thus on-state resistance and termination resistance of each of the I/O circuits 62-0 to 62-7 are adjusted to an optimal value.

An example of the ZQ calibration is described with reference to FIG. 19.

The core chip goes into a busy state at a point in time T1. Then, a signal PULLUP is activated. For a period of time for which the signal PULLUP is activated, impedance adjustment of the pull-up circuit 202 is performed. In the impedance adjustment of the pull-up circuit 202, the pull-up and pull-down control circuit 208 compares the voltage VPULLUP of the RZQ terminal with a reference voltage VCCQ/2, and adjusts the voltages VZQP0 to VZQP4 in such a manner that the voltage VPULLUP of the RZQ terminal and the reference voltage VCCQ/2 are equal to each other.

Specifically, the pull-up and pull-down control circuit 208 sets the voltages VZQP0 to VZQP4 to be all at high levels "1, 1, 1, 1, 1". Accordingly, the PMOS transistors P0A to P4A of the pull-up circuit 202 are off. At this time, the voltage VPULLUP of the RZQ terminal, for example, is a ground voltage, and is lower than the reference voltage VCCQ/2. As a result, the pull-up and pull-down control circuit 208 counts down the voltages VZQP0 to VZQP4 and sets the voltages VZQP0 to VZQP4 to "0, 1, 1, 1, 1". At this point, the counting-down means that "1" (high level) which is a value of any of the voltages VZQP0 to VZQP4 is changed to "0" (low level). Furthermore, the counting-up means that "0" (low level) which is a value of any of the voltages VZQP0 to VZQP4 is changed to "1" (high level).

When the voltages VZQP0 to VZQP4 are set to "0, 1, 1, 1, 1", the PMOS transistor P0A of the pull-up circuit 202 is on, and PMOS transistors P1A to P4A are off. Accordingly, the voltage VPULLUP of the RZQ terminal increases slightly.

If the voltage VPULLUP is still lower than the reference voltage VCCQ/2, the pull-up and pull-down control circuit 208 counts down the voltages VZQP0 to VZQP4 to "0, 0, 1, 1, 1". As a result, the voltage VPULLUP of the RZQ terminal further increases. In this manner, if the voltage VPULLUP is lower than the reference voltage VCCQ/2, the counting-down of the voltages VZQP0 to VZQP4 are sequentially repeated, and the voltage VPULLUP increases. That is, the impedance of the pull-up circuit 202 decreases.

When the voltage VPULLUP is higher than the reference voltage VCCQ/2, the voltages VZQP0 to VZQP4 are counted up. For example, in a case where the voltages VZQP0 to VZQP4 are "0, 0, 0, 1, 1", the voltages VZQP0 to VZQP4 are set to "0, 0, 1, 1, 1". In this manner, the voltages VZQP0 to VZQP4 are counted down or up depending on which of the voltage VPULLUP of the RZQ terminal and the reference voltage VCCQ/2 is higher and lower. As a result, the voltage VPULLUP of the RZQ terminal becomes stable in the vicinity of the reference voltage VCCQ/2.

When the voltage VPULLUP of the RZQ terminal becomes stable in the vicinity of the reference voltage VCCQ/2, the signal PULLUP is deactivated (at a low level). Accordingly, the pull-up and pull-down control circuit 208 ends the counting of the voltages VZQP0 to VZQP4, and causes a count value at that time to be fixed. Then, the impedance adjustment of the pull-up circuit 202 is ended by fixing the voltages VZQP0 to VZQP4. The impedance of the pull-up circuit 202 at this time is a value that is equal to an impedance value of the resistor R. 5-bit calibration data indicating the fixed voltages VZQP0 to VZQP4 is written to the register 122.

While the operation described above is performed, the impedance adjustment of the pull-up circuit 204 is performed in the same manner. More specifically, in the pull-up circuit 204, the voltages VZQP0 to VZQP4 that are the same as those of the pull-up circuit 202 are set as well. That is, the impedance of the pull-up circuit 204 is set to a value that is the same as that of the pull-up circuit 202.

Next, the impedance of the pull-down circuit 206 is adjusted in such a manner to be the same as the impedance of each of the pull-up circuits 202 and 204. More specifically, in a state where the impedance of each of the pull-up circuits 202 and 204 is fixed, a signal PULLDOWN is activated (at a high level). For a period of time for which the signal PULLDOWN is activated, the impedance adjustment of the pull-down circuit 206 is performed. In the impedance adjustment of the pull-down circuit 206, the pull-up and pull-down control circuit 208 compares a voltage VPULLDOWN of the node A with the reference voltage VCCQ/2, and the voltages VZQN0 to VZQN4 are adjusted in such a manner that the voltage VPULLDOWN of the node A and the reference voltage VCCQ/2 are equal to each other.

Specifically, the pull-up and pull-down control circuit 208 sets the voltages VZQN0 to VZQN4 to be all at low levels "0, 0, 0, 0, 0". Accordingly, the NMOS transistors N0 to N4 of the pull-down circuit 206 are off. At this time, the voltage VPULLDOWN of the node A, for example, is a power source voltage, and is higher than the reference voltage VCCQ/2. As a result, the pull-up and pull-down control circuit 208 counts up the voltages VZQN0 to VZQN4, and set the voltages VZQN0 to VZQN4 to "1, 0, 0, 0, 0".

When the voltages VZQN0 to VZQN4 are set to "1, 0, 0, 0, 0", the NMOS transistor N0 of the pull-down circuit 206 is on, and NMOS transistors N1 to N4 are off. Accordingly, the voltage VPULLDOWN of the node A decreases.

If the voltage VPULLDOWN is higher than the reference voltage VCCQ/2, the pull-up and pull-down control circuit 208 counts up the voltages VZQN0 to VZQN4 to "1, 1, 0, 0, 0". As a result, the voltage VPULLDOWN of the node A further decreases. In this manner, if the voltage VPULLDOWN is higher than the reference voltage VCCQ/2, the counting-up of the voltages VZQN0 to VZQN4 are sequentially repeated, and the voltage VPULLDOWN decreases. That is, the impedance of the pull-down circuit 206 decreases.

On the other hand, when the voltage VPULLDOWN is lower than the reference voltage VCCQ/2, the voltages VZQN0 to VZQN4 are counted down. For example, in a case where the voltages VZQN0 to VZQN4 are "1, 1, 1, 0, 0", the voltages VZQN0 to VZQN4 are set to "1, 1, 0, 0, 0". In this manner, the voltages VZQN0 to VZQN4 are counted up or down depending on which of the voltage VPULLDOWN of the NODE A and the reference voltage VCCQ/2 is higher and lower. As a result, the voltage VPULLDOWN of the node A becomes stable in the vicinity of the reference voltage VCCQ/2.

When the voltage VPULLDOWN of the node A becomes stable in the vicinity of the reference voltage VCCQ/2, at a point in time T2, the signal PULLDOWN is deactivated (at a low level). Then, the core chip is in a ready state. Accordingly, the pull-up and pull-down control circuit 208 ends the counting of the voltages VZQN0 to VZQN4, and causes a count value at that time to be fixed. Then, the impedance adjustment of the pull-down circuit 206 is ended by fixing the voltages VZQN0 to VZQN4. The impedance of the pull-down circuit 206 at this time is a value that is equal to the impedance of the pull-up circuit 204. The 5-bit calibration data indicating the fixed voltages VZQN0 to VZQN4 is written to the register 122. That is, the impedance of each of the pull-up circuits 202 and 204 and the pull-down circuit 206 is set to be equal to the resistance R.

Figure 20:
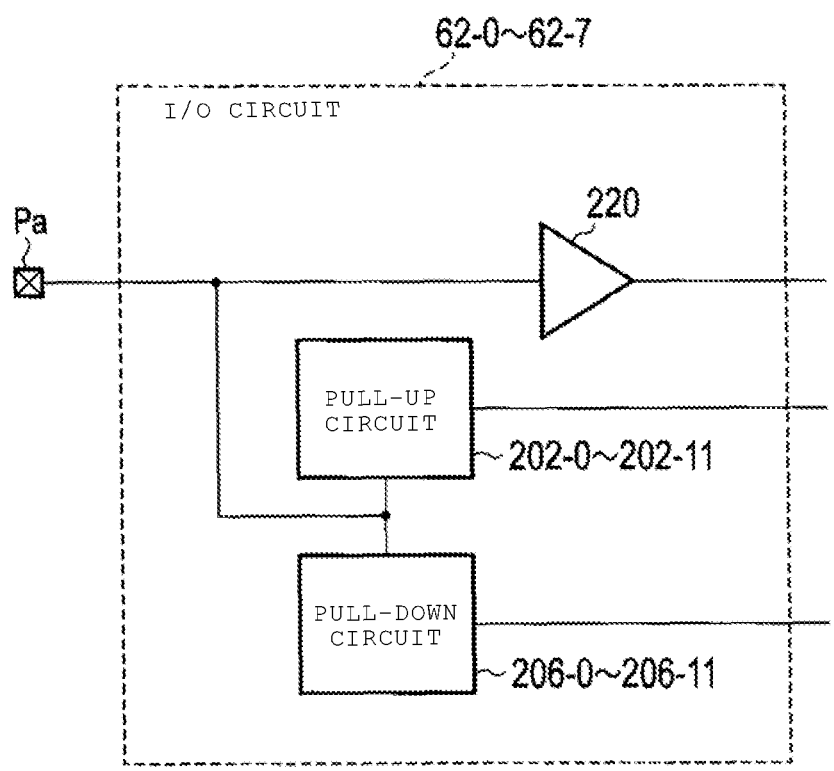
FIG. 20 is a diagram illustrating an example of an I/O circuit that causes on-state resistance and termination resistance to be corrected with a result of ZQ calibration.

FIG. 20 illustrates configuration of the I/O circuits 62-0 to 62-7. A signal that is input from the pad Pa is taken into the IF chip 106 through an input receiver 220 (the input receiver IR in FIG. 3). A plurality of pull-up circuits, each of which has the same structure as the pull-up circuit 202 that is illustrated in FIG. 16, for example, 12 pull-up circuits 202-0 to 202-11 are connected in parallel to each other. A plurality of pull-down circuits, each of which has the same structure as the pull-down circuit 206 that is illustrated in FIG. 18, for example, 12 pull-down circuits 206-0 to 206-11 are connected in parallel to each other. A parallel connection circuit that includes the pull-up circuits 202-0 to 202-11, and a parallel connection circuit that includes the pull-down circuits 206-0 to 206-11 are connected in series to each other, and connection points of both of the parallel connection circuits are connected to the pad Pa.

In a case where a signal is output, the pull-up circuits 202-0 to 202-11 that are connected in parallel to each other are on, and the pull-down circuits 206-0 to 206-11 that are connected in parallel to each other are off. Thus, an H level signal is output from the pad Pa, the pull-up circuits 202-0 to 202-11 that are connected in parallel to each other are off, and the pull-down circuits 206-0 to 206-11 that are connected in parallel to each other are on. Thus, an L level signal is output from the pad Pa. The on-state resistance of each of the pull-up circuits 202-0 to 202-11 that are connected in parallel to each other, or the on-state resistance of each of the pull-down circuits 206-0 to 206-11 that are connected in parallel to each other corresponds to on-state resistance Ron.

In a case where a signal is input, the pull-up circuits 202-0 to 202-11 that are connected in parallel to each other, and the pull-down circuits 206-0 to 206-11 that are connected in parallel to each other are together on. Parallel resistance, which results from the on-state resistance of each of the pull-up circuits 202-0 to 202-11 that are connected in parallel to each other, or the on-state resistance of each of the pull-down circuits 206-0 to 206-11 that are connected in parallel to each other corresponds to termination resistance Rtt.

The voltages VZQP0 to VZQP4, which are determined with the calibration data that is read from the register 122, are supplied to the PMOS transistors P0A to P4A, respectively, of each of the pull-up circuits 202-0 to 202-11. For this reason, the impedance of each of the pull-up circuits 202-0 to 202-11 is the impedance value of the resistor R. The voltages VZQN0 to VZQN4, which are determined with the calibration data that is read from the register 122, are supplied to the NMOS transistors N0 to N4, respectively, of each of the pull-down circuit 206-0 to 206-11. For this reason, the impedance of each of the pull-down circuit 206-0 to 206-11 is the impedance value of the resistor R as well.

The semiconductor memory device according to the embodiment can select the on-state resistance Ron and the termination resistance Rtt of the I/O circuit 62 from among several resistance values. For example, it is possible that the on-state resistance Ron is selected from among 50 Ω, 35 Ω, and 25 Ω, and it is possible that the termination resistance Rtt is selected from among 150 Ω, 100 Ω, 75 Ω, 50 Ω and nothing. Twelve parallel connection circuits, the pull-up circuits 202-0 to 202-11 that are connected in parallel to each other, and the pull-down circuits 206-0 to 206-11 that are connected in parallel to each other, are not always used, but the number of parallel connection circuits depends on setting values of the on-state resistance Ron and the termination resistance Rtt. For example, in a case where the on-state resistance Ron is set to 25 Ω, twelve pull-up circuits 202 that are connected in parallel to each other, and twelve pull-down circuits 206 that are connected in parallel to each other are configured. In a case where the on-state resistance Ron is set to 50 Ω, six pull-up circuits 202 that are connected in parallel to each other and six pull-down circuits 206 that are connected in parallel to each other are configured. In a case where the termination resistance is set to 150 Ω, only one pull-up circuit 202 and one pull-down circuit 206 are used. In a case where the termination resistance is set to 75 Ω, two pull-up circuits 202 and two pull-down circuits 206 are configured.

The above description relates to the ZQ calibration of one channel. Because the IF chip 106 includes an interface between two channels, the ZQ calibration described above is performed for each channel. In the normal NAND memory system for two channels, since a different memory chip is connected to each channel, there is a need to perform the ZQ calibration for each channel. However, in the third embodiment, because one core chip includes the interface between two channels, the channels are the same in a process, a temperature, and a voltage. Thus, there is no need to perform the ZQ calibration for each channel. If the ZQ calibration is performed in one channel and the result of the ZQ calibration is reflected in other channels, the performing of the ZQ calibration on other channels can be omitted. In the third embodiment, the ZQ calibration is performed in each of the two channels (this is referred to as a second mode), but it is possible that the ZQ calibration is selectively performed in one channel (For example, the first channel CH0) to reflect the result of the ZQ calibration in other channels (this is referred to as a second mode). As this selection method, there are a method of using the same ZQ command in the first mode and the second mode by setting a parameter using the Set Feature sequence, a method of using different ZQ commands in the first mode and the second mode, and a method that results from combing both methods.

Figure 21:
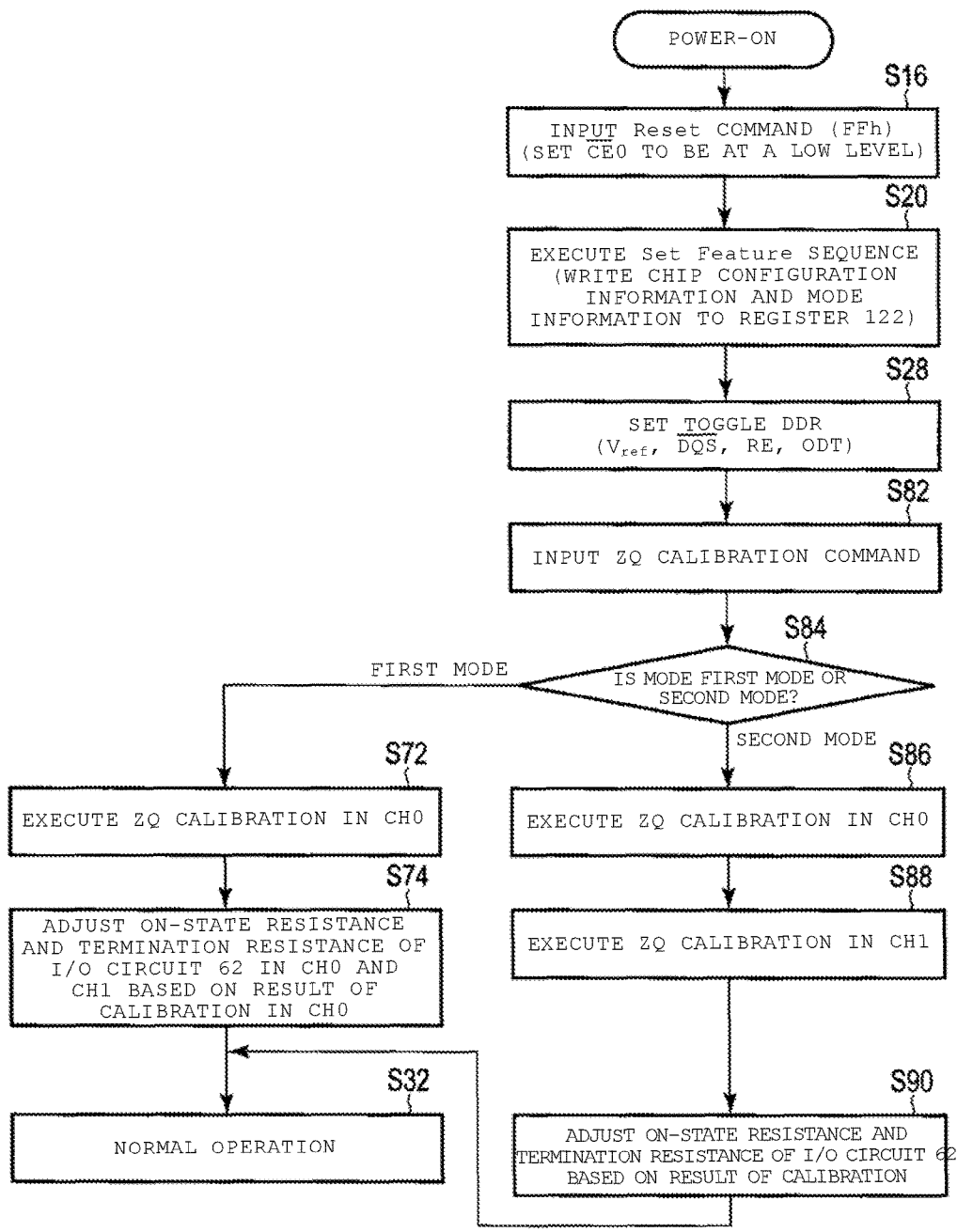
FIG. 21 is a flowchart illustrating an example of the ZQ calibration operation.

FIG. 21 is a flowchart illustrating an example of the ZQ calibration in a method of using the same ZQ command "F9*h*" using the Set Feature sequence. The command "F9*h*" is a command in which the ZQ calibration circuit 212 in a channel that receives the command "F9*h*" performs the ZQ calibration and sets a result of the calibration for the I/O circuit 62 in the channel.

In the same manner as in the first embodiment, after the power-on reset, the Set Feature sequence is executed in S20. In the third embodiment, in addition to the chip configuration, setting of calibration mode information is performed as well. A parameter for setting a mode for a predetermined address of a register is allocated, and with the Set Feature sequence, "0" (which indicates the first mode) or "1" (which indicates the second mode) is set for the parameter. After toggle setting (S28), in S82, the controller 104 issues the ZQ calibration command "F9*h*", and sends the command to the IF chip 106 through the first channel CH0. The ZQ calibration command is also true for the first mode and the second mode.

When receiving the ZQ calibration command, in S84, the IF chip 106 determines whether the calibration mode is the first mode or the second mode, based on whether a mode designation parameter is "0" or "1".

Figure 19:
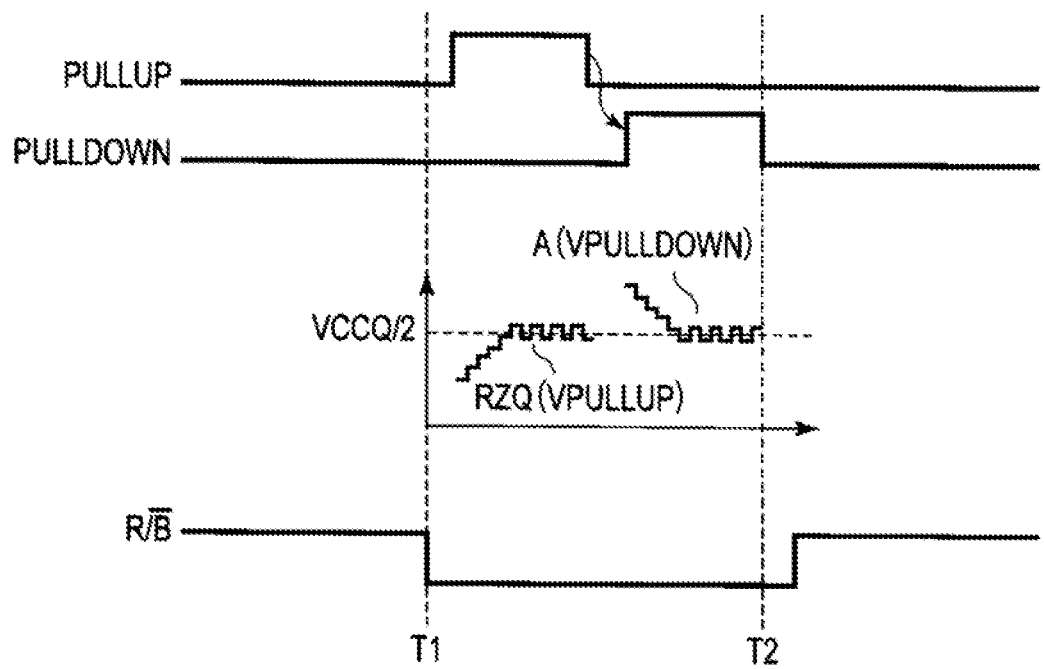
FIG. 19 is a timing chart illustrating an example of a ZQ calibration operation.

In a case where a result of the determination in S84 is the first mode, in S72, the ZQ calibration as illustrated in FIG. 19 is performed in the calibration circuit 212 in the first channel CH0, and the voltages VZQN0 to VZQN4 and the voltages VZQN0 to VZQN4 are obtained in which the impedance of each of the pull-up circuits 202 and 204 and the pull-down circuit 206 of the calibration circuit 212 is an optimal value. Pieces of calibration data that indicate the voltages VZQP0 to VZQP4 and the voltages VZQN0 to VZQN4 are written to the register 122.

FIGS. 22A and 22B are timing charts illustrating an example of the ZQ calibration in the case of the first mode. FIG. 22A is a timing chart of the first channel CH0. FIG. 22B is a timing chart of the second channel CH1. In the first mode, because the ZQ calibration is performed only in the first channel CH0, the command "F9*h*" is supplied to the IF chip 104 only through the first channel CH0.

In FIG. 22A, the chip enable signal CEn0 is activated, a command latch enable signal CLE0 and an address latch enable signal ALE0 are deactivated, and a write enable signal WEn0 is deactivated. Thereafter, the command latch enable signal CLE0 and the write enable signal WEn0 are activated, and "F9*h*" is transferred with the I/O signal DQx. In a state of being synchronized to the deactivation (the rising edge) of the write enable signal WEn0, "F9*h*" in the I/O signal DQx is input into the IF chip 106 as a command.

The command latch enable signal CLE0 is deactivated, the address latch enable signal ALE0 is activated, the write enable signal WEn0 is activated, and then "XXh" is transferred with the I/O signal DQx. In a state of being synchronized to the deactivation (the rising edge) of the write enable signal WEn0, "XXh" in the I/O signal DQx is input into the IF chip 106 as an address. Thereafter, the address latch enable signal ALE is deactivated, and the ZQ calibration in the first channel CH0 is performed. The ready/busy signal R/Bn0 is in a busy state while the ZQ calibration is performed.

In FIG. 22B, because the chip enable signal CEn1 remains deactivated, the ZQ command is not input into the second channel CH1, the ZQ calibration in the second channel CH1 is not performed, and the ready/busy signal R/Bn1 remains in a ready state.

With the "ZQ calibration" in FIGS. 22A and 22B, the calibration data indicating a voltage at which the impedance is an optimal value is obtained, and the obtained calibration data is written to the register 122.

In S74, the IF chip 106 reads a result of the ZQ calibration in the first channel CH0 from the register 122. The IF chip 106 supplies the voltages VZQP0 to VZQP4 and VZQN0 to VZQN4, which are based on the result of the calibration, to gates of the PMOS transistors P0A to P4A of each of the pull-up circuits 202-0 to 202-11 and gates of the NMOS transistors N0 to N4 of each of the pull-down circuits 206-0 to 206-11, respectively, of the I/O circuits 62-0 to 62-7 in each channel. Accordingly, the on-state resistance and the termination resistance of each of the I/O circuits 62-0 to 62-7 in the first and second channels CH0 and CH1 are adjusted to optimal values.

Thereafter, in the same manner as in the first embodiment, a normal operation is started in S32.

In a case where a result of the determination in S84 is the second mode, in S86, the ZQ calibration as illustrated in FIG. 19 is performed in the calibration circuit 212 in the first channel CH0, and the voltages VZQP0 to VZQP4 and the voltages VZQN0 to VZQN4 are obtained in which the impedance of each of the pull-up circuits 202 and 204 and the pull-down circuit 206 of the calibration circuit 212 is an optimal value. Pieces of calibration data that indicate the voltages VZQP0 to VZQP4 and the voltages VZQN0 to VZQN4 are written to the register 122. In S88, in the same manner, the ZQ calibration is performed in the calibration circuit 212 in the second channel CH1, and the voltages VZQP0 to VZQP4 and the voltages VZQN0 to VZQN4 are obtained in which the impedance of each of the pull-up circuits 202 and 204 and the pull-down circuit 206 of the calibration circuit 212 is an optimal value. Pieces of calibration data that indicate the voltages VZQP0 to VZQP4 and the voltages VZQN0 to VZQN4 are written to the register 122.

Figure 23A:
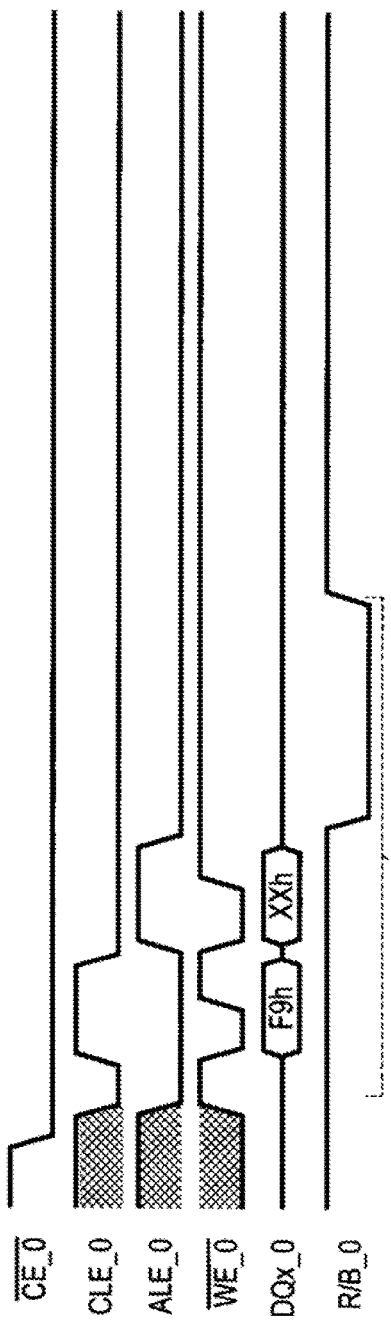
FIGS. 23A and 23B are timing charts illustrating an example of the ZQ calibration operation in a second mode.
Figure 23B:
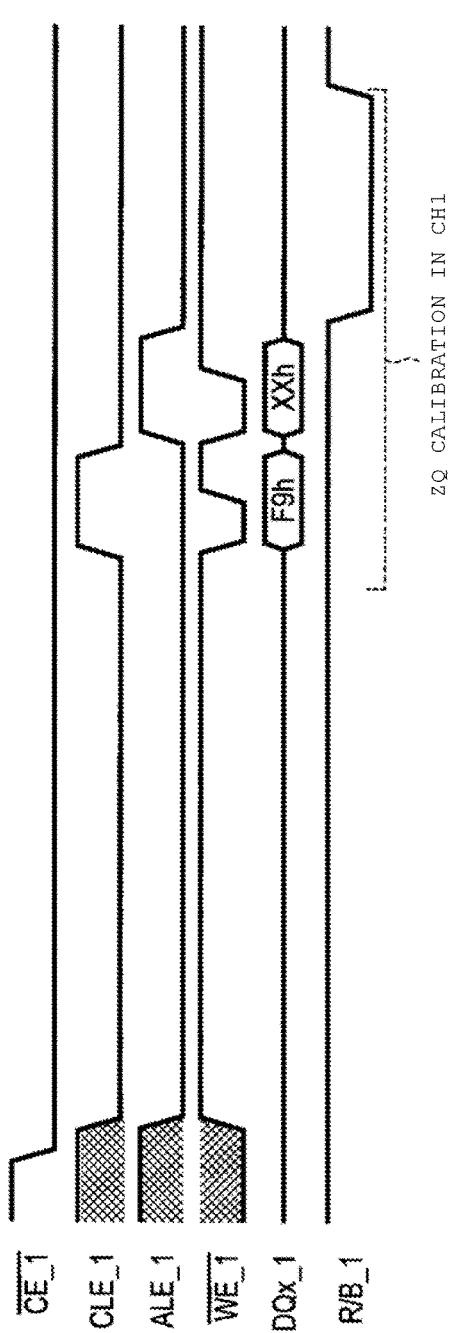

FIGS. 23A and 23B are timing charts illustrating an example of the ZQ calibration in the case of the second mode. FIG. 23A is a timing chart of the first channel CH0. FIG. 23B is a timing chart of the second channel CH1. In the second mode, because the ZQ calibration is performed in each of the first channel CH0 and the second channel CH1, the command "F9$h$" is supplied to the IF chip 104 through each of the first channel CH0 and the second channel CH1.

In FIG. 23A, the chip enable signal CEn0 is activated, the command latch enable signal CLE0 and the address latch enable signal ALE0 are deactivated, and the write enable signal WEn0 is deactivated. Thereafter, the command latch enable signal CLE0 and the write enable signal WEn0 are activated, and "F9$h$" is transferred with an I/O signal DQx0. In a state of being synchronized to the deactivation (the rising edge) of the write enable signal WEn0, "F9$h$" in the I/O signal DQx is input into the IF chip 106 as a command.

The command latch enable signal CLE0 is deactivated, the address latch enable signal ALE0 is activated, the write enable signal WEn0 is activated, and then "XXh" is transferred with the I/O signal DQx0. In a state of being synchronized to the deactivation (the rising edge) of the write enable signal WEn0, "XXh" in the I/O signal DQx0 is input into the IF chip 106 as an address. Thereafter, the address latch enable signal ALEO is deactivated, and the ZQ calibration in the first channel CH0 is performed. The ready/busy signal R/Bn0 is in a busy state while the ZQ calibration is performed.

In FIG. 23B, the chip enable signal CEn1 is activated, the command latch enable signal CLE1 and the address latch enable signal ALE1 are deactivated, and the write enable signal WEn1 is deactivated. Thereafter, the ZQ calibration in the first channel is ended, the ready/busy signal R/Bn0 in the first channel is in a ready state, and then the command latch enable signal CLE1 and the write enable signal WEn1 are activated and "F9$h$" is transferred with an I/O signal DQx1. In a state of being synchronized to the deactivation (the rising edge) of the write enable signal WEn1, "F9$h$" in the I/O signal DQx1 is input into the IF chip 106 as an address.

The command latch enable signal CLE1 is deactivated, the address latch enable signal ALE1 is activated, the write enable signal WEn1 is activated, and then "XXh" is transferred with the I/O signal DQx1. In a state of being synchronized to the deactivation (the rising edge) of the write enable signal WEn1, "XXh" in the I/O signal DQx1 is input into the IF chip 106 as an address. Thereafter, the address latch enable signal ALE1 is deactivated, and the ZQ calibration in the second channel CH1 is performed. The ready/busy signal R/Bn1 is in a busy state while the ZQ calibration is performed.

With the "ZQ calibration" in FIGS. 23A and 23B, the calibration data indicating the voltage at which the impedance is an optimal value is obtained, and the obtained calibration data may be written to the register 122 and a voltage that is based on the calibration data maybe supplied to an I/O circuit in each channel. As is the case in FIGS. 22A and 22B, the calibration data may be written to the register 122.

In S90, the IF chip 106 reads a result of the ZQ calibration in each of the first channel CH0 and the second channel CH1 from the register 122, and supplies the voltages VZQP0 to VZQP4 and VZQN0 to VZQN4, which are based on the result of the calibration, to the gates of the PMOS transistors P0A to P4A of each of the pull-up circuits 202-0 to 202-11 and the gates of the NMOS transistors N0 to N4 of each of the pull-down circuits 206-0 to 206-11, respectively, of the I/O circuits 62-0 to 62-7 in the first channel and the second channel. Accordingly, the on-state resistance and the termination resistance of each of the I/O circuits 62-0 to 62-7 in the first and second channels CH0 and CH1 are adjusted to optimal values.

Thereafter, in the same manner as in the first embodiment, a normal operation is started in S32.

Next, a method of using different ZQ commands in the first mode and the second mode will be described. For example, the ZQ command in the first mode and ZQ command in the second mode are set to be "G9$h$" and "F9$h$", respectively. The flowchart in this case is the same as that in FIG. 21, but with the difference that in the Set Feature sequence in S20, only the chip configuration information is set for the register 122, and mode information is not set for the register 122. The command "G9$h$" is a command in which the ZQ calibration circuit 212 in the channel that receives the command "G9$h$" performs the ZQ calibration, and sets a result of the calibration for the I/O circuits 62 in both of the channels.

Figures 24A, 24B:
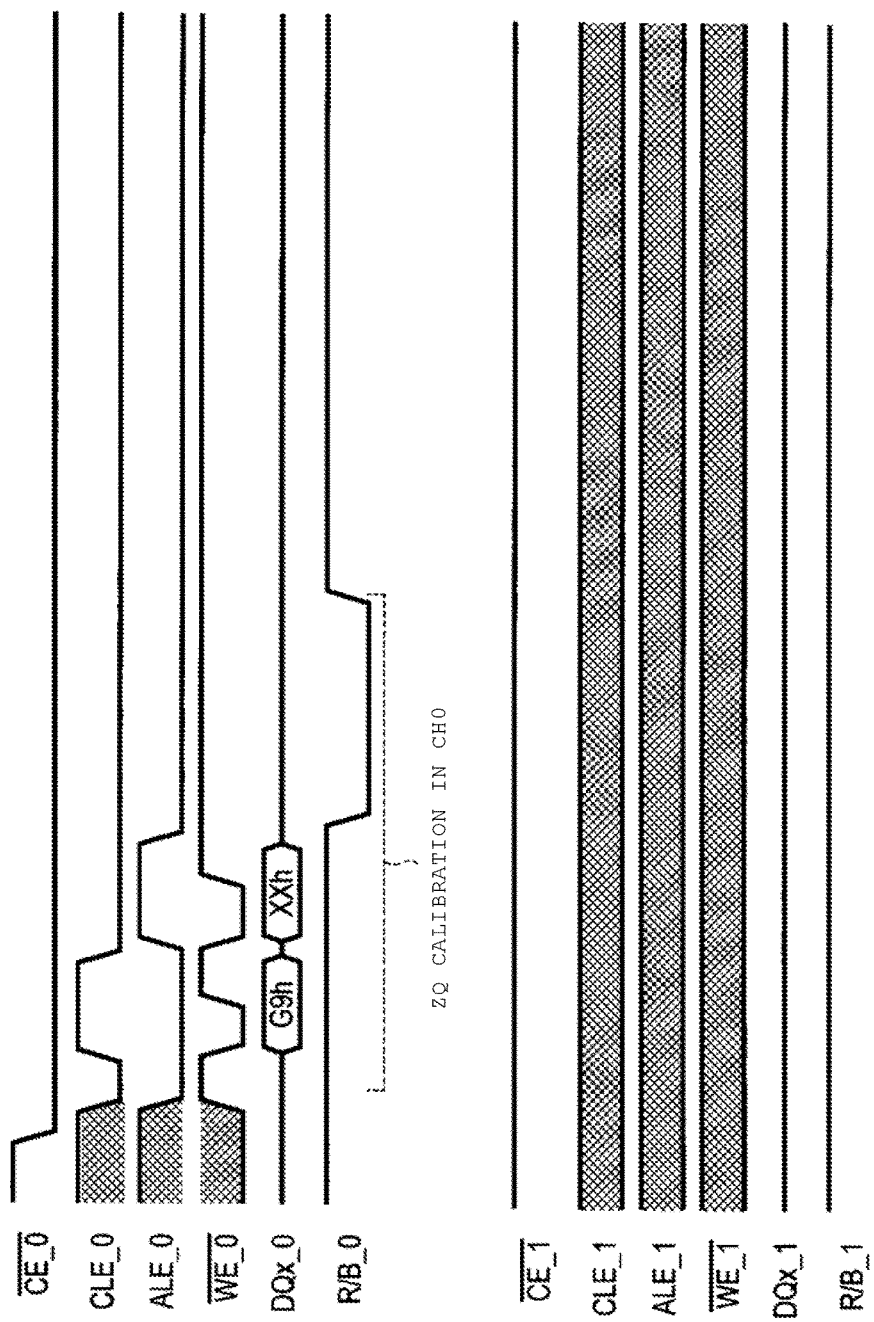
FIGS. 24A and 24B are timing charts illustrating an example of the ZQ calibration operation in the first mode.

FIGS. 24A and 24B are timing charts illustrating an example of the ZQ calibration in the case of the first mode. FIG. 24A is a timing chart of the first channel CH0. FIG. 24B is a timing chart of the second channel. In the first mode, because the ZQ calibration is performed only in the first channel CH0, the command "G9$h$" is supplied to the IF chip 104 only through the first channel CH0.

In FIG. 24A, the chip enable signal CEn0 is activated, the command latch enable signal CLE0 and the address latch enable signal ALE0 are deactivated, and the write enable signal WEn0 is deactivated. Thereafter, the command latch enable signal CLE0 and the write enable signal WEn0 are activated, and "G9$h$" is transferred with the I/O signal DQx. In a state of being synchronized to the deactivation (the rising edge) of the write enable signal WEn0, "G9$h$" in the I/O signal DQx is input into the IF chip 106 as a command.

The command latch enable signal CLE0 is deactivated, the address latch enable signal ALE0 is activated, the write enable signal WEn0 is activated, and then "XXh" is transferred with the I/O signal DQx. In a state of being synchronized to the deactivation (the rising edge) of the write enable signal WEn0, "XXh" in the I/O signal DQx is input into the IF chip 106 as an address. Thereafter, the address latch enable signal ALE is deactivated, and the ZQ calibration in the first channel CH0 is performed. The ready/busy signal R/Bn0 is in a busy state while the ZQ calibration is performed.

In FIG. 24B, because the chip enable signal CEn1 remains deactivated, the ZQ command is not input into the second channel CH1, the ZQ calibration in the second channel CH1 is not performed, and the ready/busy signal R/Bn1 remains in a ready state.

With the "ZQ calibration" in FIGS. 24A and 24B, the calibration data indicating the voltage at which the impedance is an optimal value is obtained, and the obtained calibration data is written to the register 122. After the "ZQ calibration", the calibration data is read from the register 122, and the voltage that is based on the calibration data is supplied to the I/O circuit in each channel.

Figure 25A:
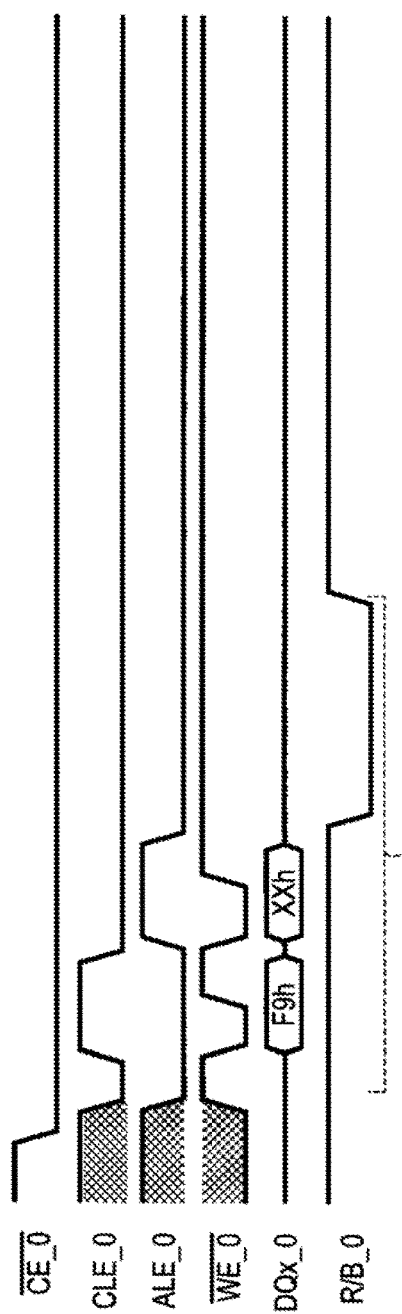
FIGS. 25A and 25B are timing charts illustrating an example of the ZQ calibration operation in the second mode.
Figure 25B:
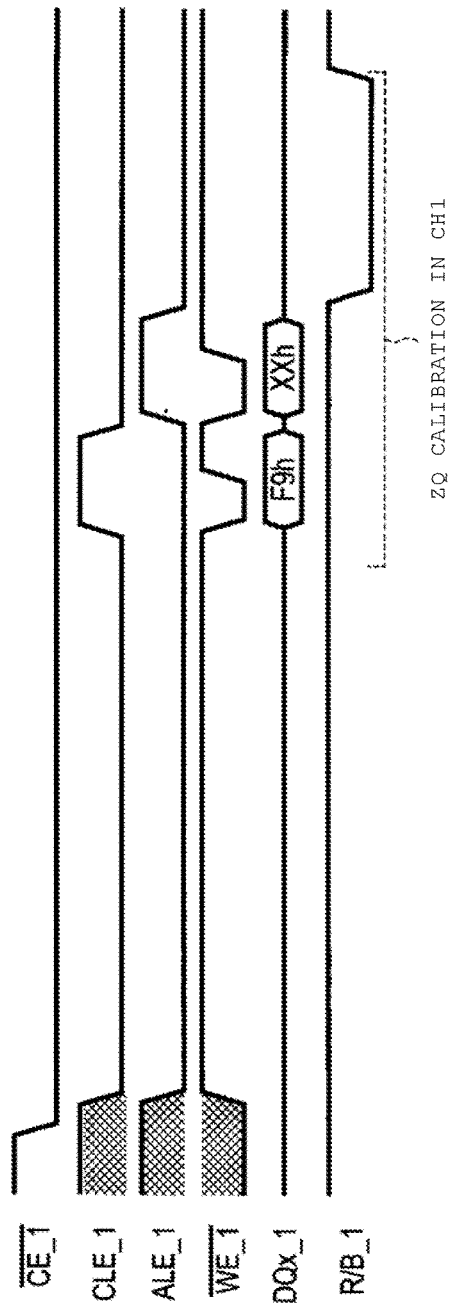

FIGS. 25A and 25B are timing charts illustrating an example of the ZQ calibration in the case of the second mode. FIG. 25A is a timing chart of the first channel CH0.

FIG. 25B is a timing chart of the second channel CH1. In the second mode, because the ZQ calibration is performed in each of the first channel CH0 and the second channel CH1, the command "F9h" is supplied to the IF chip 104 through each of the first channel CH0 and the second channel CH1.

In FIG. 25A, the chip enable signal CEn0 is activated, the command latch enable signal CLE0 and the address latch enable signal ALE0 are deactivated, and the write enable signal WEn0 is deactivated. Thereafter, the command latch enable signal CLE0 and the write enable signal WEn0 are activated, and "F9h" is transferred with an I/O signal DQx0. In a state of being synchronized to the deactivation (the rising edge) of the write enable signal WEn0, "F9h" in the I/O signal DQx is input into the IF chip 106 as a command.

The command latch enable signal CLE0 is deactivated, the address latch enable signal ALE0 is activated, the write enable signal WEn0 is activated, and then "XXh" is transferred with the I/O signal DQx0. In a state of being synchronized to the deactivation (the rising edge) of the write enable signal WEn0, "XXh" in the I/O signal DQx0 is input into the IF chip 106 as an address. Thereafter, the address latch enable signal ALEO is deactivated, and the ZQ calibration in the first channel CH0 is performed. The ready/busy signal R/Bn0 is in a busy state while the ZQ calibration is performed.

In FIG. 25B, the chip enable signal CEn1 is activated, the command latch enable signal CLE1 and the address latch enable signal ALE1 are deactivated, and the write enable signal WEn1 is deactivated. Thereafter, the ZQ calibration in the first channel is ended, the ready/busy signal R/Bn0 in the first channel is in a ready state, and then the command latch enable signal CLE1 and the write enable signal WEn1 are activated and "F9h" is transferred with an I/O signal DQx1. In a state of being synchronized to the deactivation (the rising edge) of the write enable signal WEn1, "F9h" in the I/O signal DQx1 is input into the IF chip 106 as a command.

The command latch enable signal CLE1 is deactivated, the address latch enable signal ALE1 is activated, the write enable signal WEn1 is activated, and then "XXh" is transferred with the I/O signal DQx1. In a state of being synchronized to the deactivation (the rising edge) of the write enable signal WEn1, "XXh" in the I/O signal DQx1 is input into the IF chip 106 as an address. Thereafter, the address latch enable signal ALE1 is deactivated, and the ZQ calibration in the second channel CH1 is performed. The ready/busy signal R/Bn1 is in a busy state while the ZQ calibration is performed.

With the "ZQ calibration" in FIGS. 25A and 25B, the calibration data indicating the voltage at which the impedance is an optimal value is obtained, and the obtained calibration data may be written to the register 122 and a voltage that is based on the calibration data maybe supplied to an I/O circuit in each channel. As is the case in FIGS. 22A and 22B, the calibration data may be written to the register 122.

The two mode selection methods may be combined. That is, the first mode and the second mode may be selectively executed by setting the mode designation parameter using the Set Feature sequence and by using a different command for each mode.

According to the third embodiment, the ZQ calibration is performed in each of the two channels, but it is possible that the ZQ calibration is performed in one channel and that whether or not a result of the calibration is reflected in the other channel is selected according to the request of the user, e.g., in consideration of the processing time. Thus, various requests can be flexibly satisfied. In a case where only the first mode is requested, the ZQ calibration circuit 212 may be provided in the first channel CH0, and because the ZQ calibration circuit 212 does not need to be provided in the second channel CH1, a circuit area can be reduced. The RZQ terminal in the second channel in which the ZQ calibration is not performed can be omitted. In a case where the RZQ terminal is provided, the RZQ terminal can be set to be floating. For this reason, the degree of freedom in substrate wiring is improved as well.

A timing at which the ZQ calibration is performed is not limited to the time when a power source is turned on. A temperature measurement sensor and a voltage measurement sensor are provided and in a case where a detection signal from these sensors varies greatly, and so forth, the ZQ calibration may be performed.

Points in Common to Embodiments: Register Configuration

As described above, because each core chip is independent, each chip needs to have the register for data retention or control setting retention. The register 122 includes a register for an interface, but such a register does not need to be provided for each core chip. As described with reference to FIG. 5, the registers 122 according to the embodiment are categorized by a type of information to be stored, and are arranged in an area relating to the information to be stored, that is, the IF chip 106, the core chip 108, or both. An example of the arrangement is illustrated in FIG. 26. FIG. 26 illustrates main data of the register 122.

Figure 27:
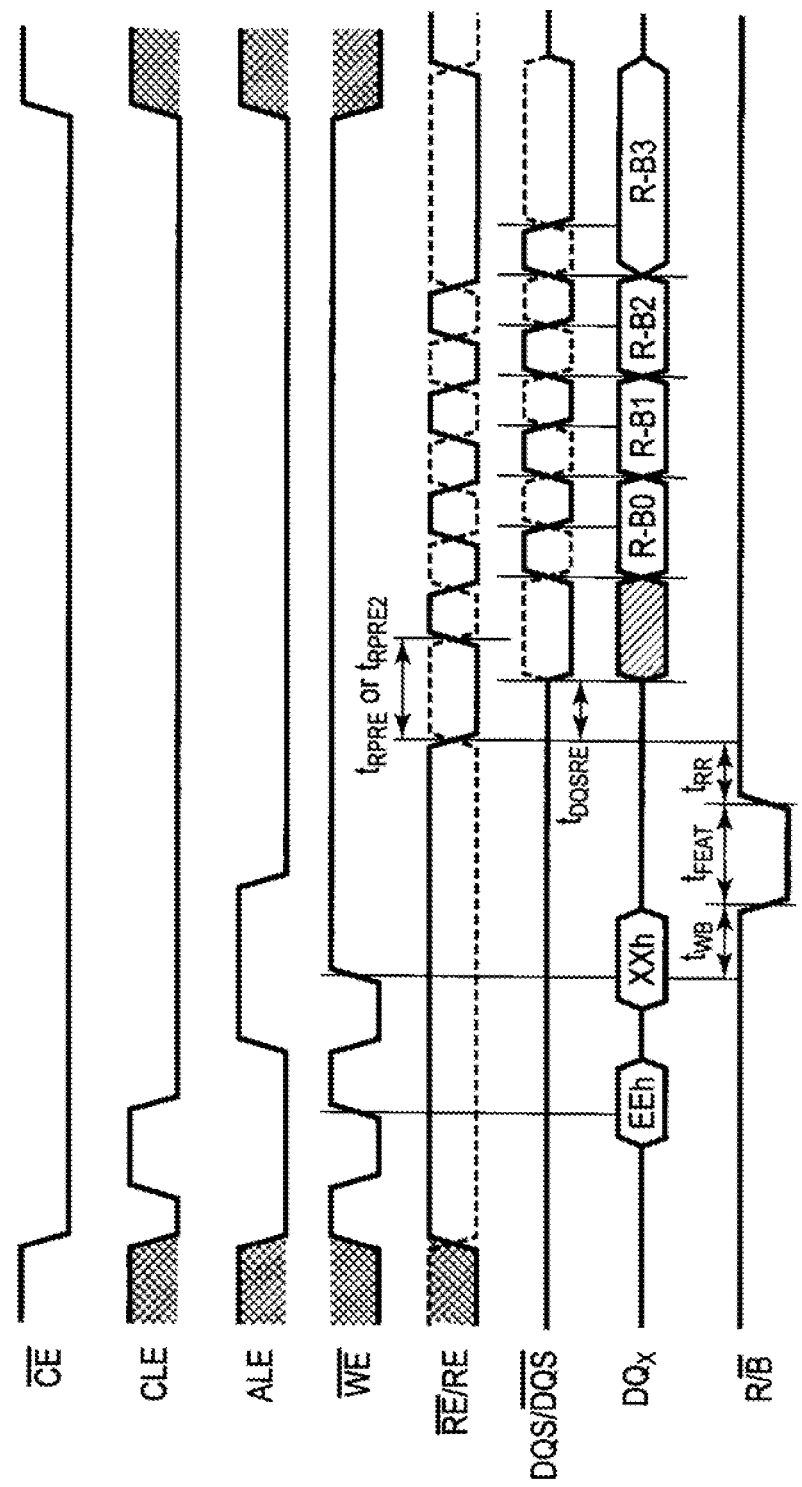
FIG. 27 is a timing chart illustrating an example of a parameter reading sequence.

A command EEh is a command to start the Set Feature sequence, and EFh is a command to start a Get Feature sequence. An example of the Get Feature sequence is illustrated in FIG. 27. The Get Feature sequence is substantially the same as the Set Feature sequence. Data in the Set Feature sequence is data that is written to the register 122, but data in the Get Feature sequence is data that is read from the register 122. Pieces of data R-B0, R-B1, R-B2, and R-B3 are read in a state of being synchronized to a falling edge (or a rising edge of the data strobe signal DSQn) of the data strobe signal DSQ.

What chip in which a register that is used in the Set Feature sequence and the Get Feature sequence is arranged, is determined for each address and data. A register relating to the data transfer to the controller 104 is arranged in the IF chip 106, and a register relating to data reading/writing from and to a memory cell is arranged in the core chip 108.

For example, "Vref switching" of bit 0 in data B0 at address 02h, "DQS differential switching" of bit 1 in data B0 at address 02h, "RE differential switching" of bit 2 in data B0 at address 02h, "Reserve" of bit 3 in data B0 at address 02h, and "ODT resistance value" of bit 4 to bit 7 in data B0 at address 02h are arranged in the IF chip 106. 0 in "Vref switching" indicates internal occurrence inside of a chip, and indicates input from the outside. 0 and 1 in "DQS differential switching" and "RE differential switching" indicate a single and a differential, respectively. Bits 4 to 7 in "ODT resistance value" is a setting value of termination resistance of I/O circuit 62, and indicates any one of off, 150 Ω, 100 Ω, 75 Ω, and 50 Ω.

"Input latency setting" of bits 0 to 3 in data B1 at address 02h and "output latency setting" of bits 4 to 7 are arranged in the IF chip 106. "Input latency setting", and "output latency setting" indicate the delay time (unit:cycle).

The latency is a function of delaying a data start timing when performing transfer. For example, the latency is used in a case where an initial operation is not stable, or in a case where data is quickly output and preparation is not completely made for reception on the controller side.

Figure 28:
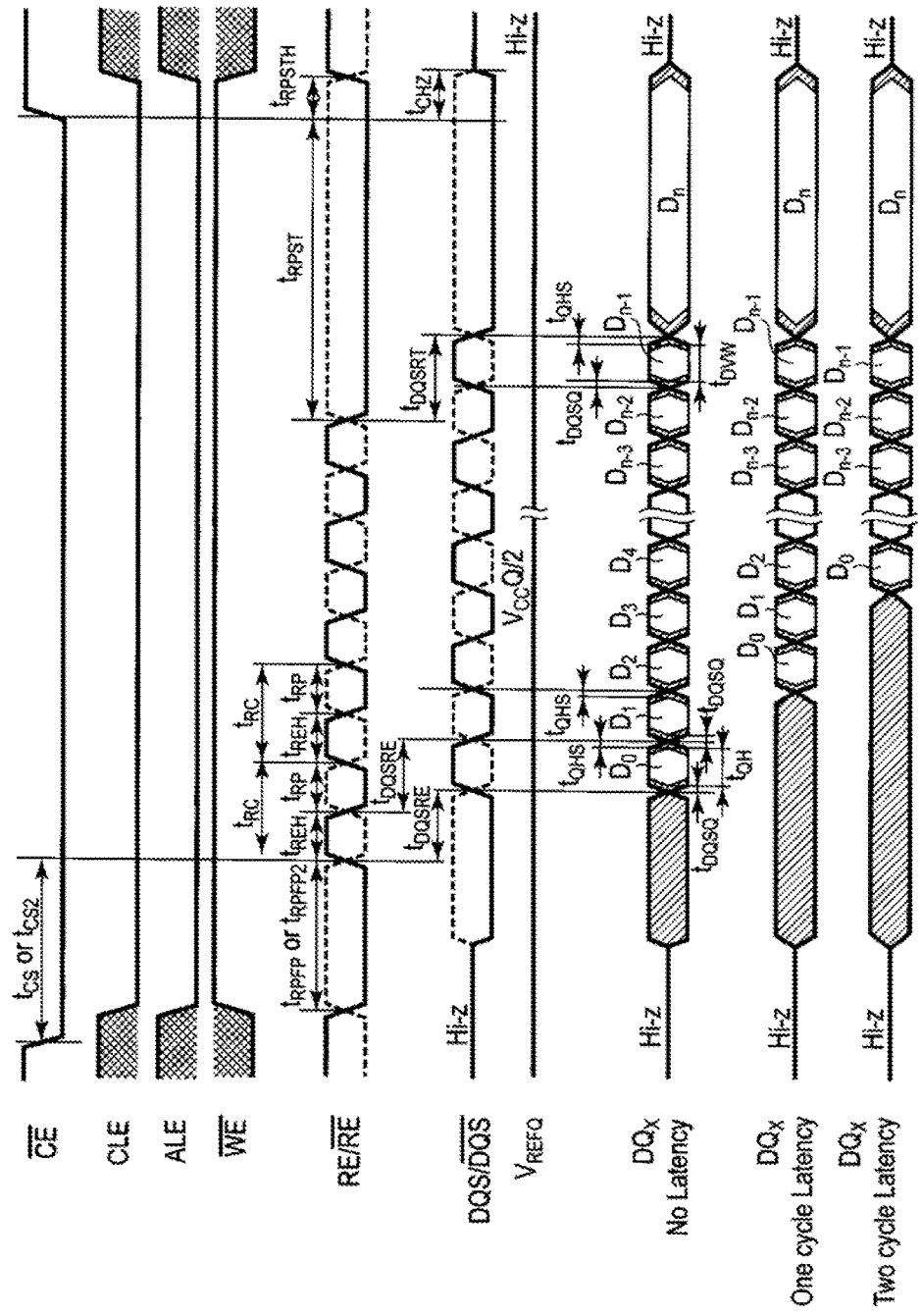
FIG. 28 is a timing chart for illustrating latency.

The output latency is described with reference to FIG. 28. The chip enable signal CE is activated, and then the data strobe signal DQS is once deactivated. Thereafter, the data strobe signal DQS is repeatedly activated and deactivated in a periodical manner. In a case where the latency is 0, in a state of being synchronized to an initial rising edge of the data strobe signal DQS, data D1 is output to the I/O signal, and thereafter, in a state of being synchronized to a rising edge/falling edge of the data strobe signal DQS, data D2, data D3, and so forth are output to the I/O signal.

In a case where the latency is in one cycle, in a state of being synchronized to the second rising edge of the data strobe signal DQS, data D1 is output to the I/O signal, and thereafter, in a state of being synchronized to the rising edge/falling edge of the data strobe signal DQS, data D2, data D3, and so forth are output to the I/O signal. In the same manner, in a case where the latency is in two cycles, in a state of being synchronized to the third rising edge of the data strobe signal DQS, data D1 is output to the I/O signal, and thereafter, in a state of being synchronized to the rising edge/falling edge of the data strobe signal DQS, data D2, data D3, and so forth are output to the I/O signal.

"Off chip driver (OCD) Ron adjustment" of bits 1 to 2 in data B0 at address 10h is disposed in the IF chip 106. Bits 1 to 2 in "OCD Ron adjustment" are a setting value of the termination resistance of the I/O circuit 62, and indicate any of 50 Ω, 35 Ω, and 25 Ω.

"Reading voltage adjustment" of bits 0 to 7 in data BO to data B3 at address 85h is disposed in the core chip 108. Because the repeating of the writing causes a characteristic of the flash memory to deteriorate and causes an optimal reading voltage to change, a reading voltage can be adjusted after shipping on the user side.

"Number-of-in-use-channels setting" of bits 0 and 1 in data B0 at address B0h, "Number-of-in-use-chip-enable setting" of bits 2 and 3, and "number-of-in-use-ready/busy setting" of bits 4 and 5 are arranged in both of the core chip 108 and the IF chip 106. "Number-of-in-use-channels setting" indicates the use of only channel 0 or the use of channel 0 and channel 1, and "number-of-in-use-chip-enable setting" and "number-of-in-use-ready/busy setting" are the number of the chip enable signals CEnx and the number of the ready/busy signals R/Bn, respectively, and indicate 1, 2, or 4.

As illustrates in FIG. 26, the register 122 is disposed in both of the IF chip 106 and the core chip 108, and information relating to an interface for the data transfer to an external controller or the like is stored by the register within the IF chip 106, and information relating to reading and writing of data from and to the memory cell is stored by the register within the core chip 108. Thus, the information relating to the interface is not stored in a plurality of core chips in an overlapping manner. For this reason, a circuit area of the core chip is not wastefully increased, and an area of the core chip can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory chips that are stacked above one another and connected to each other through a through via;
   an interface chip that is connected to the plurality of memory chips; and
   a plurality of first terminals for connection with an external device,
   wherein the interface chip includes a plurality of second terminals that are connected to the plurality of first terminals, and is capable of receiving a signal that is supplied from the external device through the first and second terminals, and stores configuration information according to which a set number of the second terminals are designated for receiving control signals for the plurality of memory chips.

2. The semiconductor memory device according to claim 1, wherein the set number of the second terminals designated in the configuration information is at least one.

3. The semiconductor memory device according to claim 1, wherein
   the plurality of memory chips is divided into four or more groups, each group having at least two memory chips and a unique chip address that is shared among the memory chips of the group, and the set number of the second terminals designated in the configuration information is at least two.

4. The semiconductor memory device according to claim 1, wherein each of the first terminals is connected to a different one of the second terminals.

5. The semiconductor memory device according to claim 1, wherein the second terminals are each allocated to receive a chip enable signal from the external device.

6. The semiconductor memory device according to claim 1, wherein the interface chip includes a plurality of third terminals that are connected to the plurality of first terminals and are each allocated to output a ready/busy signal to the external device.

7. The semiconductor memory device according to claim 6, wherein the configuration information also designates a set number of the third terminals that are to be used in outputting the read/busy signal.

8. The semiconductor memory device according to claim 1, wherein the configuration information is supplied by the external device.

9. The semiconductor memory device according to claim 1, wherein one of the memory chips stores the configuration information and the configuration information is read from said one of the memory chips.

10. A semiconductor memory device comprising:
    a plurality of memory chips that are stacked above one another and connected to each other through a through via; and
    an interface chip connected to the plurality of memory chips, the interface chip including first and second input/output circuits and a plurality of terminals through which signals are transmitted between the interface chip and external devices, wherein
    the first input/output circuit includes a calibration circuit configured to adjust an on-state resistance and a termination resistance of the first input/output circuit using a calibration resistor connected to the calibration circuit through one of the terminals, and
    the interface chip stores configuration information designating one of a first calibration mode in which calibration results from the calibration circuit are applied to both the first and second input/output circuits and a second calibration mode in which the calibration results from the calibration circuit are applied to only to the first input/output circuit and the second input/output circuit is calibrated separately.

11. The semiconductor memory device according to claim 10, wherein the second input/output circuit includes a calibration circuit configured to adjust an on-state resistance and a termination resistance of the second input/output circuit using another calibration resistor connected to the calibration circuit through another one of the terminals.

12. The semiconductor memory device according to claim 10, wherein the calibration circuit is a replica circuit of the first input/output circuit and includes a plurality of transistors connected in parallel, and the calibration results indicate different gate voltages that are respectively applied to the transistors of the calibration circuit.

13. The semiconductor memory device according to claim 12, wherein
each of the first and second input/output circuits includes a plurality of transistors connected in parallel, and
the different gate voltages indicated by the calibration results are respectively applied to the transistors in the first input/output circuit and also respectively applied to the transistors in the second input/output circuit.

14. The semiconductor memory device according to claim 10, wherein the configuration information is set in response to a command received from an external device.

15. A semiconductor memory device comprising:
a plurality of memory chips that are stacked above one another and connected to each other through a through via, each of the memory chips including a first register; and
an interface chip connected to the plurality of memory chips, and including a second register,
wherein the first register stores parameters relating to reading and writing and does not store parameters relating to an interface of data exchange with an external device, and the second register stores parameters relating to an interface of data exchange with an external device.

16. The semiconductor memory device according to claim 15, wherein the interface chip includes first and second input/output circuits.

17. The semiconductor memory device according to claim 16, wherein the parameters stored in the second register include calibration results to be applied to the first and second input/output circuits.

18. The semiconductor memory device according to claim 15, wherein
the interface chip includes a plurality of terminals through which signals from the external device control the plurality of memory chips, and
the parameters stored in the second register include configuration information according to which a set number of the terminals are designated to receive the signals from the external device.

19. The semiconductor memory device according to claim 18, wherein the configuration information is supplied by the external device.

20. The semiconductor memory device according to claim 18, wherein one of the memory chips stores the configuration information and the configuration information is copied from said one of the memory chips.

* * * * *